(12) United States Patent
Mayer et al.

(10) Patent No.: US 12,019,900 B2
(45) Date of Patent: Jun. 25, 2024

(54) TEMPERATURE-BASED MEMORY MANAGEMENT

(71) Applicant: Micron Technology, Inc., Boise, ID (US)

(72) Inventors: Peter Mayer, Neubiberg (DE); Thomas Hein, Munich (DE); Wolfgang Anton Spirkl, Germering (DE); Martin Brox, Munich (DE); Michael Dieter Richter, Ottobrunn (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/697,509

(22) Filed: Mar. 17, 2022

(65) Prior Publication Data

US 2022/0206705 A1  Jun. 30, 2022

Related U.S. Application Data

(62) Division of application No. 16/674,955, filed on Nov. 5, 2019, now Pat. No. 11,321,008.

(Continued)

(51) Int. Cl.
  *G06F 3/06* (2006.01)
  *G11C 7/04* (2006.01)
  *G11C 11/4074* (2006.01)

(52) U.S. Cl.
  CPC .......... *G06F 3/0653* (2013.01); *G06F 3/0604* (2013.01); *G06F 3/0673* (2013.01); *G11C 7/04* (2013.01); *G11C 11/4074* (2013.01)

(58) Field of Classification Search
  CPC .................................................. G06F 3/0653
  See application file for complete search history.

(56) References Cited

U.S. PATENT DOCUMENTS

| 8,028,198 B2 | 9/2011 | Resnick |
| 2005/0135430 A1* | 6/2005 | Le .............................. G11C 7/22 370/537 |

(Continued)

FOREIGN PATENT DOCUMENTS

| CN | 102543154 A | 7/2012 |
| JP | 2014-096188 A | 5/2014 |

OTHER PUBLICATIONS

European Patent Office, "Extended Search Report," issued in connection with European Patent Application No. 19883536.5, dated Jan. 21, 2022 (8 pages).

(Continued)

*Primary Examiner* — Douglas King
(74) *Attorney, Agent, or Firm* — Holland & Hart LLP

(57) ABSTRACT

Methods, systems, and devices for temperature-based memory management are described. A system may include a memory device and a host device. The host device may identify a temperature (e.g., of the memory device). The host device may determine a value for a parameter for operating the memory device—such as a timing, voltage, or frequency parameter—based on the temperature of the memory device. The host device may transmit signaling to the memory device or another component of the system based on the value of the parameter. In some cases, the host device may determine the temperature of the memory device based on an indication (e.g., provided by the memory device). In some cases, the host device may determine the temperature of the memory device based on a temperature of the host device or a temperature of another component of the system.

18 Claims, 14 Drawing Sheets

Related U.S. Application Data

(60) Provisional application No. 62/767,780, filed on Nov. 15, 2018.

(56) References Cited

U.S. PATENT DOCUMENTS

| | | |
|---|---|---|
| 2006/0236027 A1 | 10/2006 | Jain et al. |
| 2007/0028146 A1 | 2/2007 | Ruckerbauer |
| 2007/0109013 A1 | 5/2007 | Lee et al. |
| 2007/0174642 A1* | 7/2007 | Cornwell ............ G06F 1/26 713/300 |
| 2008/0068873 A1 | 3/2008 | Matsuno et al. |
| 2008/0239856 A1 | 10/2008 | Thorp et al. |
| 2010/0014345 A1* | 1/2010 | Choi ............ G11C 5/025 365/163 |
| 2011/0205826 A1* | 8/2011 | Kuroda ............ G11C 11/40626 365/222 |
| 2012/0224425 A1* | 9/2012 | Fai ............ G11C 16/26 365/185.09 |
| 2012/0249218 A1 | 10/2012 | Shoemaker |
| 2014/0281311 A1 | 9/2014 | Walker et al. |
| 2014/0371945 A1 | 12/2014 | Sato |
| 2015/0279446 A1 | 10/2015 | Halbert et al. |
| 2018/0090218 A1 | 3/2018 | Takada et al. |
| 2018/0293029 A1 | 10/2018 | Achtenberg et al. |
| 2019/0004723 A1 | 1/2019 | Li et al. |

OTHER PUBLICATIONS

ISA/KR, International Search Report and Written Opinion of the International Searching Authority, Int'l. Appl. No. PCT/US2019/060069, dated Apr. 9, 2020, Korean Intellectual Property Office, Seo-gu, Daejeon, Republic of Korea, 12 pgs.

Korean Patent Office, "Office Action," issued in connection with Korean Patent Application No. 10-2021-7016888 dated Apr. 24, 2023 (20 pages) (11 pages of English Translation and 9 pages of Original Document).

Chinese Patent Office, "Office Action," issued in connection with Chinese Patent Application No. 201980085016.8 dated Oct. 20, 2023 (20 pages; 10 pages original & 10 pages machine translation).

* cited by examiner

TEMPERATURE-BASED MEMORY MANAGEMENT

CROSS REFERENCE

The present application for patent is a divisional of U.S. patent application Ser. No. 16/674,955 by Mayer et al., entitled "TEMPERATURE-BASED MEMORY MANAGEMENT," filed Nov. 5, 2019, which claims priority to U.S. Provisional Patent Application No. 62/767,780 by Mayer et al., entitled "TEMPERATURE-BASED MEMORY MANAGEMENT," filed Nov. 15, 2018, each of which is assigned to the assignee hereof and each of which is expressly incorporated by reference in its entirety herein.

BACKGROUND

The following relates generally to a system that includes at least one memory device and more specifically to temperature-based memory management.

Memory devices are widely used to store information in various electronic devices such as computers, wireless communication devices, cameras, digital displays, and the like. Information is stored by programing different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including those that employ magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, such as PCM and FeRAM, may maintain stored logic states for extended periods of time even in the absence of an external power source. Volatile memory devices, such as DRAM, may lose stored logic states over time unless they are periodically refreshed by a power source. In some cases, non-volatile memory may use similar device architectures as volatile memory but may have non-volatile properties by employing such physical phenomena as ferroelectric capacitance or different material phases.

In some applications, a memory device may be included as part of, or be otherwise associated with (e.g., coupled with, controlled by) a host device. The host device may be configured for operation in an environment associated with an ambient temperature range, and at least some operations of the memory device may relate to temperature.

DETAILED DESCRIPTION

Figure 1:
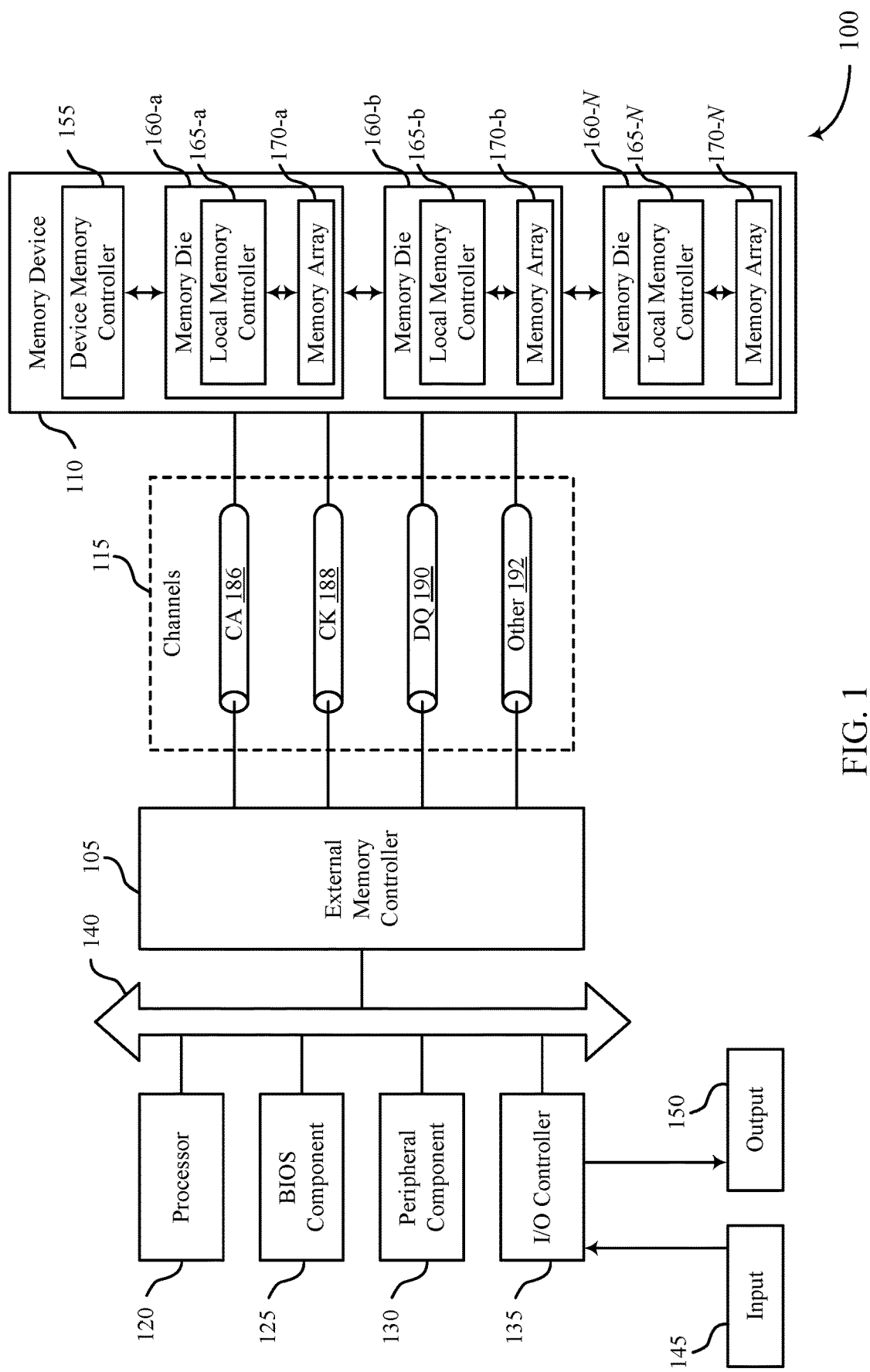
FIG. 1 illustrates an example of a system that supports temperature-based memory management as disclosed herein.

A system or host device that includes a memory device may be designed or configured to operate in a range of ambient temperatures that is different than a range of operating temperatures designed or configured for the memory device. For example, automotive systems (e.g., vehicles, vehicle components, vehicle processors or controllers), networking systems (e.g., wireless base stations), or mobile devices may be designed to operate in relatively low ambient temperatures (e.g., an ambient temperature as low as −40° C., an ambient temperature range of −40° C. to 105° C. or 115° C.), which may be lower than a designed operating temperature (e.g., supported, having one or more guaranteed or otherwise specified performance characteristics) of a memory device (e.g., as low as 0° C.).

One or more aspects of memory device operation may be temperature-dependent, and it may be desirable to ensure consistent memory device performance across the temperature range expected for a system or host device. In various examples, the value of one or more operating parameters of the memory device (e.g., timing parameters, voltage parameters, frequency parameters) may be determined (adjusted, selected, optimized) based on the temperature of a memory device or based on an indication of a temperature of the memory device (e.g., an indication of a bulk temperature of the memory device, an indication of an average temperature of the memory device, an indication of an aggregate temperature of the memory device). In some cases, the host device may store (e.g., in a basic input/output system (BIOS)) multiple sets of values for one or more operating parameters of the memory device, and each set of values for the operating parameters may correspond to (e.g., be optimized for) a temperature range of the memory device. The host device may determine (e.g., select) a value of an operating parameter (e.g., of a set of operating parameters) based on the temperature of the memory device (e.g., corresponding to temperature range that includes the temperature of the memory device).

In some cases, the host device may adjust its own operation (e.g., the timing, voltage, or another characteristic of signaling the host device transmits to the memory device) based on determining the value of the operating parameter. Additionally or alternatively, the host device may adjust the operation of the memory device based on determining the operating parameter (e.g., by indicating the selected operating parameter to the memory device, so that the memory device may thereafter operate according to the selected operating parameter). Additionally or alternatively, the host device may adjust the operation of the memory device based on determining the operating parameter by adjusting the operation of another aspect of the system (e.g., by indicating the selected operating parameter to the other aspect of the system), such as by adjusting the voltage of a power supply to the memory device.

Further, in some cases, a system or host device that includes a memory device may share a common cooling system (e.g., heat sink or other apparatus designed to passively or actively control the temperature of the memory device and host device together). In some cases, the host device may determine the temperature of the memory device based on its own temperature (that is, based on the temperature of the host device, which the host device may treat as being equal to or at some offset relative to the temperature of the memory device) or based on the temperature of the common cooling system (which the host device may treat as being equal to or at some offset relative to the temperature of the memory device). In some cases, the host device may determine the temperature of the memory device based on a reading (e.g., signaling) provided to the host device from the memory device.

Features of the disclosure are initially described in the context of a memory system and a memory die as described with reference to FIGS. 1 and 2. Features of the disclosure are further described in the context of a system and a temperature profile for temperature-based memory management as described with reference to FIGS. 3 and 4. These and other features of the disclosure are further illustrated by and described with reference to apparatus diagrams, system diagrams, and flowcharts that relate to temperature-based memory management as described with reference to FIGS. 5 through 14.

FIG. 1 illustrates an example of a system 100 that supports temperature-based memory management as disclosed herein. The system 100 may include an external memory controller 105, a memory device 110, and a plurality of channels 115 that couple the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be a component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device (e.g., a graphics processing unit (GPU)), a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be coupled with or in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a GPU, a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB)

controller, a serial or parallel port, or peripheral card slots, such as peripheral component interconnect (PCI) or accelerated graphics port (AGP) slots. The peripheral component(s) 130 may be other components as would be understood by persons of ordinary skill in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that may provide information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, etc. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include output driver circuitry and various other circuit elements, for example, conductive lines, transistors, capacitors, inductors, resistors, amplifiers, or other active or passive elements, configured to carry out the functions described herein. For example, system 100 may include one or more temperature sensors, which may be included in or otherwise coupled with the memory device, the external memory controller 105, or other aspects of system 100. System 100 may also store (e.g., in BIOS component 125) sets of values for one or more operating parameters for the memory device, each of which may correspond to (e.g., be optimized for or otherwise selected for) a temperature (e.g., temperature range) of the memory device. For example, system 100 may store the sets of values for the one or more operating parameters and corresponding temperature ranges in a look-up table.

The memory device 110 may include a device memory controller 155 and one or more memory dice 160. Each memory die 160 may include a local memory controller 165 (e.g., local memory controller 165-*a*, local memory controller 165-*b*, and/or local memory controller 165-N) and a memory array 170 (e.g., memory array 170-*a*, memory array 170-*b*, and/or memory array 170-N). A memory array 170 may be a collection (e.g., a grid) of memory cells, with each memory cell being configured to store at least one bit of digital data. Features of memory arrays 170 and/or memory cells are further described with reference to FIG. 2.

The memory arrays 170 may be examples of two-dimensional (2D) arrays of memory cells or may be examples of a three-dimensional (3D) arrays of memory cells. For example, a 2D memory device may include a single memory die 160. A 3D memory device may include two or more memory dice 160 (e.g., memory die 160-*a*, memory die 160-*b*, and/or any quantity of memory dice 160-N). In a 3D memory device, multiple memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs, increase the performance of the memory array, or both. In some 3D memory devices, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. In some examples, the external memory controller 105 may be or may be included in a host device. In some examples, the host device and the memory device 110 may be in close proximity and the host device temperature may affect the memory device temperature. As the memory device temperature changes, the host device may send signaling to the memory device 110 to adjust parameters of the memory device 110 to optimize performance, power use, and so forth.

For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other components of the system 100, or its functions described herein, may be implemented by the processor 120. For example, the external memory controller 105 may be hardware, firmware, or software, or some combination thereof implemented by the processor 120 or other component of the system 100. Although the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may, in some cases, be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be x4 (e.g., including four signal paths), x8 (e.g., including eight signal paths), x16 (including sixteen signal paths), etc.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured to adjust (e.g., oscillate) between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. In some cases, the clock signal may be a 1.5 GHz signal. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. For example, the channels 115 may include data channels 190-1 through 190-n. Each data channel may be associated with or include one or more transmission lines. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., NRZ, PAM4).

In some cases, the channels 115 may include one or more other channels 192 that may be dedicated to other purposes. These other channels 192 may include any quantity of signal paths.

In some cases, the other channels 192 may include one or more write clock signal (WCK) channels. Although the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110.

The data clock signal may be configured coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of an M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), PAM4, and/or others.

In some cases, a multi-symbol (or multi-level) modulation scheme may be used to modulate signals communicated between the external memory controller 105 and the memory device 110. A multi-symbol modulation scheme may be an example of an M-ary modulation scheme where M is greater than or equal to three. Each symbol of a multi-symbol modulation scheme may be configured to represent more than one bit of digital data (e.g., a PAM4 symbol may represent a logic 00, a logic 01, a logic 10, or a logic 11). Examples of multi-symbol modulation schemes include, but are not limited to, PAM4, PAM8, quadrature amplitude modulation (QAM), quadrature phase shift keying (QPSK), and others. A multi-symbol signal (e.g., a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In accordance with the described techniques, the system 100 may include circuitry or other components configured to optimize the performance of the memory device 110 (e.g., optimize the performance of the memory device 110, memory die 160, or memory array 170), based on the memory device temperature. The circuitry or other components configured to adjust the values of operating parameters for the memory device 110 may be activated, deactivated, or otherwise operated (e.g., by an external memory controller 105, a device memory controller 155, or a local memory controller 165) based on an indication of a temperature of the memory device 110 (e.g., generated and received from a temperature sensor associated with (e.g., include in or coupled with) the external memory controller 105, with the memory device 110, or with some other aspect of the system 100). In some examples, activating or otherwise operating the circuitry or other components configured to optimize the performance of the memory device 110 may be based on the temperature of the memory device 110.

Figure 2:
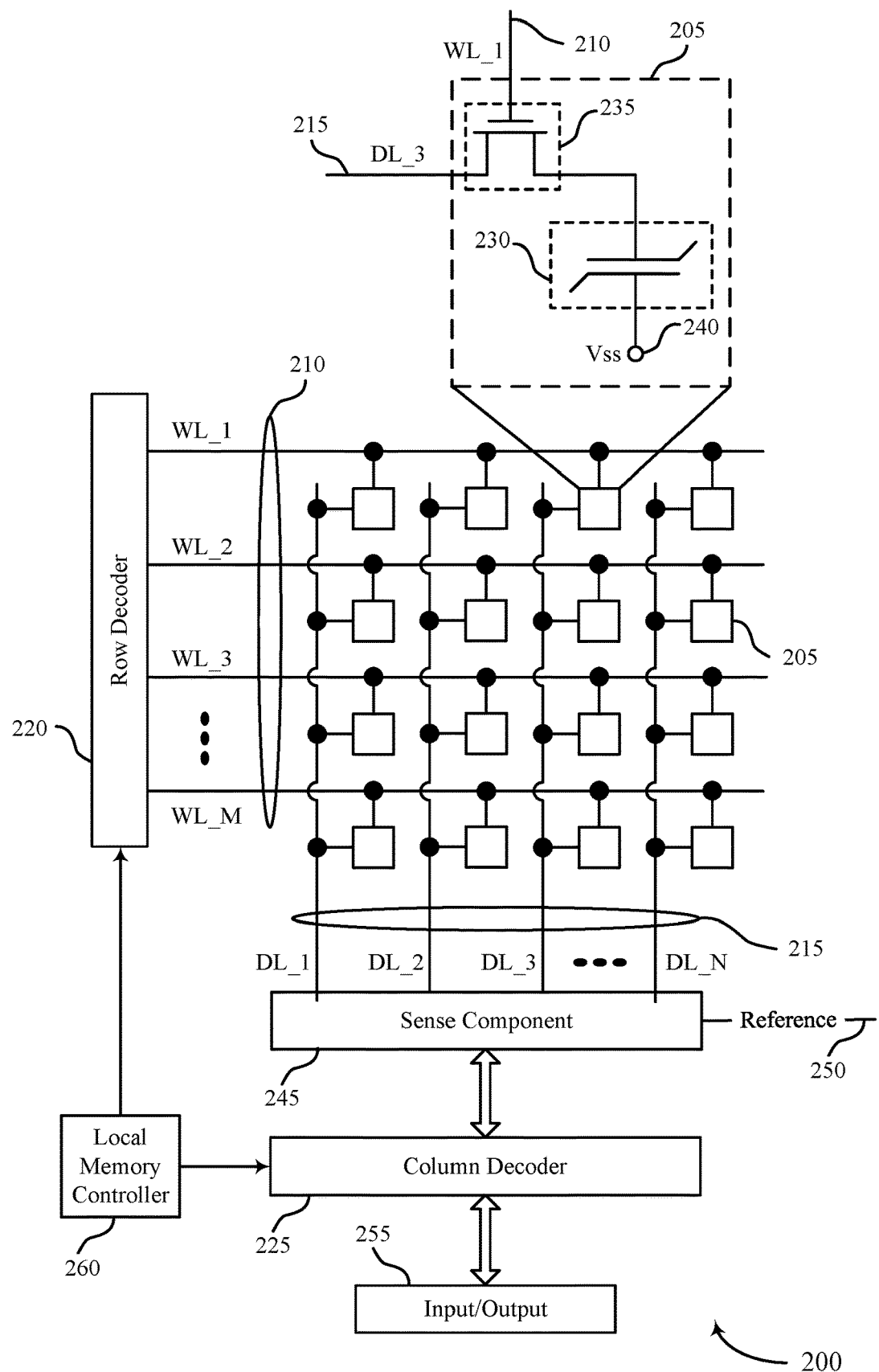
FIG. 2 illustrates an example of a memory die that supports temperature-based memory management as disclosed herein.

FIG. 2 illustrates an example of a memory die 160-b that supports temperature-based memory management as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. In DRAM architectures, a memory cell 205 may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 is a ground such as Vss. In some cases, the voltage source 240 may be an example of a plate line coupled with a plate line driver. The switching component 235 may be an example of a transistor or any other type of switch device that selectively establishes or de-establishes (e.g., ceases) electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 may be or include a transistor and its operation may be controlled by applying a voltage to the transistor gate, where the voltage differential between the transistor gate and transistor source may be greater or less than a threshold voltage of the transistor. In some cases, the switching component 235 may be or include a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that may be used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge.

During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0.

The sense component 245 may include various transistors or amplifiers to detect and amplify a difference in the signals. In some cases, the sense component 245 may be part of another component (e.g., a column decoder 225, row decoder 220). In some cases, the sense component 245 may be in electronic communication with the row decoder 220 or the column decoder 225

The detected logic states of memory cells 205, as determined by the sense component 245, may be output through column decoder 225 as output 255. Output 255 may pass the detected logic states to one or more intermediary components (e.g., a local memory controller) for transfer over one or more channels (e.g., for transmission over one or more transmission lines). Thus, the detected logic state of memory cells 205 may be conveyed to devices or components external to memory die 200.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations.

The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 260 may be configured to perform a write operation (e.g., a programming operation) on one or more memory cells 205 of the memory die 200. The write operation may be for data received from an external device. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a first signal (e.g., voltage) to the digit line 215 during the write operation to store a first state (e.g., charge) in the capacitor 230 of the memory cell 205, and the first state (e.g., charge) may be indicative of a desired logic state.

In some cases, the local memory controller 260 may be configured to perform a read operation (e.g., a sense operation) on one or more memory cells 205 of the memory die 200. The read operation may be for data requested by, or intended for, an external device. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. In some examples, the local memory controller 260 may be an external memory controller 105 or host device as discussed with reference to FIG. 1.

The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

The memory die 200 illustrates a two-dimensional (2D) array of memory cells. In some cases, the memory device may include three-dimensional (3D) arrays or memory cells. A 3D memory array may include two or more 2D memory arrays stacked on top of one another. In some cases, 2D memory arrays in a 3D memory array may be referred to as decks, levels, layers, or dies. A 3D memory array may include any quantity of stacked 2D memory arrays (e.g., two high, three high, four high, five high, six high, seven high, eight high). This may increase the quantity of memory cells that may be positioned on a single die or substrate as compared with a single 2D memory array, which in turn may reduce production costs, increase the performance of the memory array, or both. In some 3D memory arrays, different decks may share at least one common access line such that some decks may share at least one of a word line 210 or a digit line 215.

One or more operational aspects of the memory die 200 may be temperature-sensitive, and the memory die 200 or a system that includes the memory die (e.g., a system such as system 100) may be configured (e.g., by selecting or otherwise adjusting operating parameters) such that the memory device 110 satisfies operational targets or parameters across the temperature range expected for the system 100 or external memory controller 105 that includes or is otherwise associated with the memory die 200. In some examples, activating, deactivating, or otherwise operating the circuitry or other components configured to manage the performance of the memory die 200 may be based on the temperature of a memory device 110 that includes the memory die 200. Various operations or functions of the memory device 110 may also be based on indications of a temperature of the memory device 110 or a component thereof.

Figure 3:
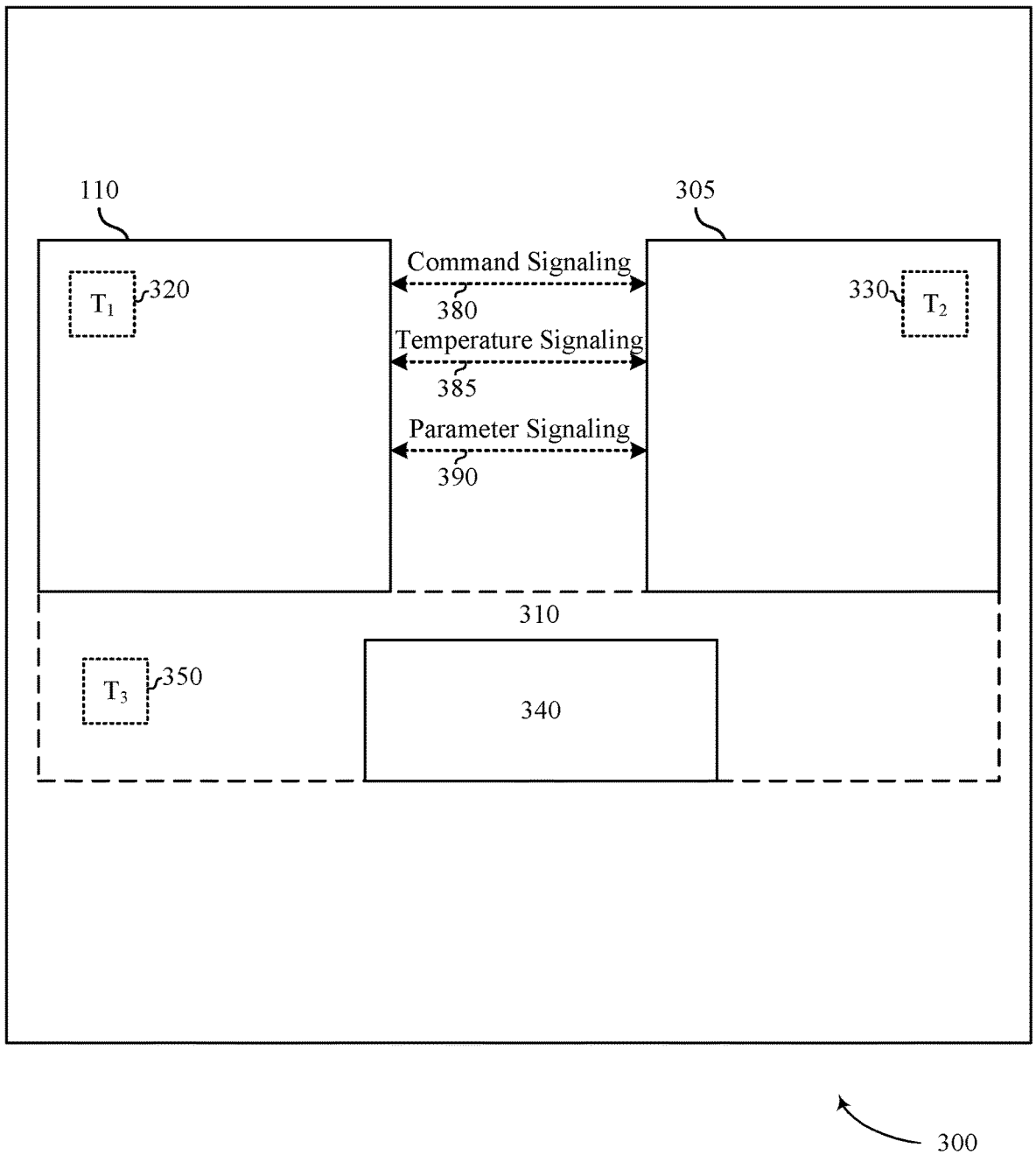
FIG. 3 illustrates an example of a system that supports temperature-based memory management as disclosed herein.

FIG. 3 illustrates an example of a system 300 that supports temperature-based memory management as disclosed herein. The system 300 may include a host device 305 and a memory device 110, which may be examples of the respective components described with reference to FIGS. 1 and 2. Although the system 300 is illustrated with one memory device 110, the components and techniques described herein may be illustrative of a system 300 that includes one memory device 110 or a set of memory devices 110 (e.g., more than one memory device 110).

The system 300 may include various temperature sensors for measuring or indicating a temperature of the memory device 110. In some examples, the system 300 may include a memory device temperature sensor 320, which may be a component of the memory device 110. A memory device temperature sensor 320 may be embedded within (e.g., as an integral component of), or coupled to any of a device memory controller 155, a memory die 160, a local memory controller 165, a memory array 170, or any other component included in the memory device 110. Although shown within the illustrative boundary of the memory device 110, a memory device temperature sensor 320 may also be coupled to (e.g., fused to, fastened to, soldered to) an outside packaging of a memory device 110, which may include a thermally conductive coupling such as a thermal paste or other coupling between thermally conductive materials. A memory device temperature sensor 320 may provide a relatively direct measurement or indication of a temperature of the memory device 110, or component thereof (e.g., a temperature $T_1$). In some cases, the memory device may have memory cells that include capacitive storage elements (e.g., capacitors).

Additionally or alternatively, the system 300 may include a host device temperature sensor 330, which may be a component of the host device 305. A host device temperature sensor 330 may be embedded within (e.g., as an integral component of), or coupled to an external memory controller 105, or where such components are included in the host device 305, a host device temperature sensor 330 may be embedded within or coupled to a processor 120, a BIOS component 125, a peripheral component 130, or an I/O controller 135. Although shown within the illustrative boundary of the host device 305, a host device temperature sensor 330 may also be coupled to (e.g., fused to, fastened to, soldered to) an outside packaging of a host device 305, which may include a thermally conductive coupling such as a thermal paste or other coupling between thermally conductive materials. The host device temperature sensor 330 may provide a relatively direct measurement or indication of a temperature of the host device 305, or component thereof (e.g., a temperature $T_2$), which in some examples or conditions, may provide a suitable measurement or indication of a temperature of the memory device 110 (e.g., a relatively indirect measurement or indication) for supporting the techniques described herein.

In some examples, the host device 305 may request the memory device temperature from the memory device 110. The memory device 110 may provide the temperature via the memory device temperature sensor 320. Based on the memory device temperature, the host device 305 may determine whether or not to adjust one or more operating parameters (e.g., timing parameters, voltage parameters, frequency parameters) of the memory device 110. Because the host device 305 and the memory device 110 may be in close proximity to one another such that the host device 305 may affect the temperature of the memory device 110, any time the host device 305 may change temperature, this may trigger a new memory device temperature determination (e.g., read out or other manner of determining the memory device temperature) and the host device 305 may adjust the parameters of the memory device 110 accordingly.

In some examples, the host device 305 and the memory device 110 may be coupled via a coupling component 310, but in various examples of the system 300, the coupling component 310, or described functions thereof, may be included in the system 300 or omitted from the system. The coupling component 310 may be a physical component of the system 300 that provides a coupling between the host device 305 and the memory device 110. The described coupling may provide the host device 305 with the temperature or an indication of the temperature of the memory device 110.

In some examples, the host device 305 and the memory device 110 may be coupled via a coupling component 310, but in various examples of the system 300, the coupling component 310, or described functions thereof, may be included in the system 300 or omitted from the system 300. The coupling component 310 may be a physical component of the system 300 that provides a coupling between the host device 305 and the memory device 110. The described coupling may include a thermal coupling that conveys thermal energy between the host device 305 and the memory device 110. For example, the coupling component 310 may have a relatively high thermal conductivity (e.g., low thermal resistance), which may facilitate heat energy transfer between the host device 305 and the memory device 110 at relatively small temperature differences between the host device 305 and the memory device 110. In other words, the coupling component 310 may support the host device 305 and the memory device 110 being at relatively similar temperatures (e.g., via a relatively strong thermal coupling).

By coupling the memory device 110 with the host device 305 via a coupling component 310 (e.g., via a thermal coupling), the host device temperature sensor 330 may provide a more accurate indication of the temperature of the memory device 110 than when the coupling component 310 is omitted. For example, when the system 300 includes the coupling component 310, the host device temperature sensor 330 may provide a more accurate indication of memory device temperature during thermal transients, or when internal heat generation of the memory device 110 is different than internal heat generation of the host device 305. However, in some examples, a coupling component 310 may be omitted from the system 300, and the host device temperature sensor 330 may be suitable for supporting the techniques described herein.

In some examples, the coupling component 310 may be specifically configured to reduce temperature differences between the host device temperature sensor 330 and the memory device 110. For example, the coupling component 310 may be a particularly-designed thermal bridge or linkage between the host device temperature sensor 330 or the host device 305 and the memory device 110, such as a thermally conductive trace or pad of a substrate (e.g., a conductive portion of a printed circuit board that both the memory device 110 and the host device 305 are coupled with). In some examples, the coupling component 310 may be configured for other purposes, but otherwise supports thermal conduction between the memory device 110 and the host device 305. For example, the coupling component 310 may be a heat sink or cooling fins configured to draw heat energy away from the memory device 110 or the host device 305, and may additionally limit temperature differences between the memory device 110 and the host device 305 (e.g., as a secondary or additional purpose of the coupling component 310). In some examples, the coupling component 310 may also refer to a conductive trace of a printed circuit board or other interfacing component configured to communicate signals between the memory device 110 and the host device 305 (e.g., signal paths associated with one or more channels 115).

Although the coupling component 310 is illustrated as a separate component from the memory device 110 and the host device 305, in various examples of the system 300, the coupling component 310, or the described characteristics thereof, may be included in one or both of the memory device 110 or the host device 305. For example, the memory device 110 may include one or more memory dice 160 mounted to a printed circuit board or other substrate, and the printed circuit board of the memory device 110 may include a thermally conductive portion that is configured to, or otherwise supports an exchange of thermal energy between the memory device 110 and the host device 305, thereby reducing temperature differences between the memory device 110 and a host device temperature sensor 330. Additionally or alternatively, the host device 305 may include a printed circuit board, and the printed circuit board of the host device 305 may include a thermally conductive portion that is configured to, or otherwise supports an exchange of thermal energy between the host device 305 and the memory device 110, thereby limiting temperature differences between the memory device 110 and a host device temperature sensor 330.

For a system 300 that includes the coupling component 310, the system 300 may include a coupling component temperature sensor 350 (e.g., in addition to, or as an alternative to one or both of a memory device temperature sensor 320 or a host device temperature sensor 330), which may be a component of the coupling component 310. A coupling component temperature sensor 350 may be embedded within (e.g., as an integral component of), or otherwise coupled to a coupling component 310, which may include a thermally conductive coupling such as a thermal paste or other coupling between thermally conductive materials. The coupling component temperature sensor 350 may provide a relatively direct measurement or indication of a temperature of the coupling component 310 (e.g., a temperature $T_3$), which in some examples or conditions, may provide a suitable measurement or indication of one or both of a temperature of the memory device 110 or a temperature of the host device 305 (e.g., a relatively indirect measurement or indication). In various examples, a coupling component temperature sensor 350 may be in communication with (e.g., may provide a temperature indication to) the memory device 110, or the host device 305, or both.

By coupling the memory device 110 with the host device 305 via a coupling component 310 and due to the close proximity of the host device 305 and the memory device 110, the host device temperature sensor 330 may provide a more accurate indication of the temperature of the memory device 110. In some examples, a coupling component 310 may be omitted from the system 300, and the host device temperature sensor 330 may be suitable for supporting the techniques described herein. In some examples, the coupling component 310 may also refer to a conductive trace of a printed circuit board or other interfacing component configured to communicate signals between the memory device 110 and the host device 305 (e.g., signal paths associated with one or more channels 115).

In some examples, the host device 305 or the memory device 110 (e.g., an external memory controller 105 or a device memory controller 155) may identify a difference between an indicated temperature of the memory device 110 and an indicated temperature of the host device 305, and the host device 305 or the memory device 110 may perform described operations or exchanged commands or signaling based on the identified difference. For example, the host device 305 may identify a difference (e.g., an offset) between a temperature indicated by a host device temperature sensor 330 or a coupling component temperature sensor 350 and a temperature indicated by a memory device temperature sensor 320, and the host device 305 perform operations based on an indication of the host device temperature sensor 330 or the coupling component temperature sensor 350, possibly adjusted based on the identified difference (offset).

In some cases, an offset between a temperature of one device and a temperature of another device (e.g., between the temperature of the host device 305 and the temperature of the memory device 110, between the temperature of the coupling component 310 and the temperature of the memory device 110) may be preconfigured at the host device 305 or the memory device 110 (e.g., stored in one or more fuses or anti-fuses), and the host device 305 or the memory device 110 may use such a preconfigured offset identified as described herein.

In some examples, the coupling component 310 may couple one or both of the memory device 110 and the host device 305 to a cooling component 340. The cooling component 340 may receive temperatures or indications of temperatures from one or both of the temperature sensor 320 of the memory device 110 and the temperature sensor 330 of the host device 305. The cooling component 340 may decrease the temperature of one or both of the memory device 110 and host device 305 based on the received temperatures of the memory device 110 and host device 305.

A memory device temperature sensor 320, a host device temperature sensor 330, or a coupling component temperature sensor 350 may include various types of components that provide an indication of temperature, and such indications may be conveyed, signaled, compared, or otherwise processed in a digital domain or an analog domain. For example, any one or more of a memory device temperature sensor 320, a host device temperature sensor 330, or a coupling component temperature sensor 350 may include a thermocouple, a thermistor, a semiconductor temperature sensor, a resistance temperature detector (RTD), or some other type of sensor.

Although illustrated as single components, any one or more of a memory device temperature sensor 320, a host device temperature sensor 330, may be repeated in the system 300. For example, the memory device 110 may include a set of memory device temperature sensors 320 distributed across multiple memory dice 160, or otherwise distributed across different locations of the memory device 110. Additionally or alternatively, the host device 305 may include a set of host device temperature sensors 330 distributed across various components of the host device 305, or otherwise distributed across different locations of the host device 305. Additionally or alternatively, the coupling component 310 may include a set of coupling component temperature sensors 350 distributed across various components of the coupling component 310, or otherwise distributed across different locations of the coupling component 310.

In some examples, a set of temperature sensors of a particular component of the system 300 may be a same type of sensor. For example, each of a set of memory device temperature sensors 320 of a memory device 110 may be semiconductor temperature sensors. In some examples, a component of the system 300 may have multiple types of temperatures sensors, which may support different temperature ranges, different operating conditions (e.g., different operating modes, different power consumption, different portions of a component being energized), redundancy, or plausibility detection. For example, the memory device temperature sensors 320 of a memory device 110 may include a set of thermocouples and one or more RTDs.

In various examples, components of the system 300 may use the same or different types of temperature sensors. For example, the memory device temperature sensor 320 a memory device 110 may include a thermocouple, and the host device temperature sensor 330 of a host device 305 may include a thermocouple, or an RTD, or both. Various other combinations of temperature sensor types may be used in memory device temperature sensors 320, or host device temperature sensors 330, in accordance with the described techniques.

The system 300 may also include various signaling between the memory device 110 and the host device 305 (e.g., an external memory controller 105 of the host device 305), which may support various operations of or between the memory device 110 and the host device 305. For example, the system 300 may support command signaling 380, temperature signaling 385, parameter signaling 390, or various combinations thereof. Each of the described signaling may be conveyed via channels 115, such as those described with reference to the system 100 of FIG. 1.

Command signaling 380 may include commands exchanged between the host device 305 the memory device 110. Command signaling 380 may be conveyed, for example, over CA channels 186 as described with reference to the system 100 of FIG. 1, or some other operational channel 115 or line between the memory device 110 and the host device 305. In some examples, a time or voltage or other characteristic of one or more commands exchanged between the host device 305 and the memory device 110 may be based on a value of a timing parameter. In some examples, the absolute time of transmission may be based on the value of the timing parameter. In some examples, an interval of time between transmissions may be based on the value of the timing parameter.

Temperature signaling 385 may include various indications of temperatures communicated between the memory device 110 or the host device 305, and may be conveyed over a data channel 190, or an EDC pin or Joint Test Action Group (JTAG) signal associated with another channel 192, such as those described with reference to system 100 of FIG. 1, or some other temperature feedback channel or line. For example, the memory device 110 and the host device 305 may exchange explicit indications of temperature (e.g., digital values conveying a temperature in degrees Fahrenheit or degrees Celsius) or implicit indications of temperature (e.g., a voltage of a thermocouple, or a voltage or current across an RTD that is otherwise associated with a particular temperature in degrees Fahrenheit or degrees Celsius). The memory device 110, for example, may provide an indication of a temperature of the memory device 110 (e.g., from a memory device temperature sensor 320) to the host device 305 via temperature signaling 385. Such temperature signaling may be used to support various examples of the described techniques for controlled and mode-dependent heating of a memory device.

Parameter signaling 390 may include various indications of operations or triggers performed by the memory device 110, and may be conveyed over a data channel 190, or an EDC pin or JTAG signal associated with another channel 192 (e.g., a power channel), as described with reference to system 100 of FIG. 1, or some other initialization feedback channel or line. Parameter signaling 390 may be conveyed from the host device 305 and may include parameter adjustments that may be based on the temperature of the memory device 110. In some examples, one or more timing parameters, frequency parameters, or voltage parameters, or any combination thereof may vary based on the temperature of the memory device 110. In some examples, the host device 305 may transmit parameter signaling 390 which may communicate adjusted parameter values based on the temperature of the memory device 110. In some examples, the adjusted parameter values may update the values of one or more mode registers at the memory device 110. The updated value may be stored on the one or more mode registers at the memory device 110 until the temperature of the memory device 110 may change and cross a threshold (e.g., a threshold temperature or boundary temperature as described herein), at which point the one or more mode registers may be updated with another adjusted parameter value.

Figure 4:
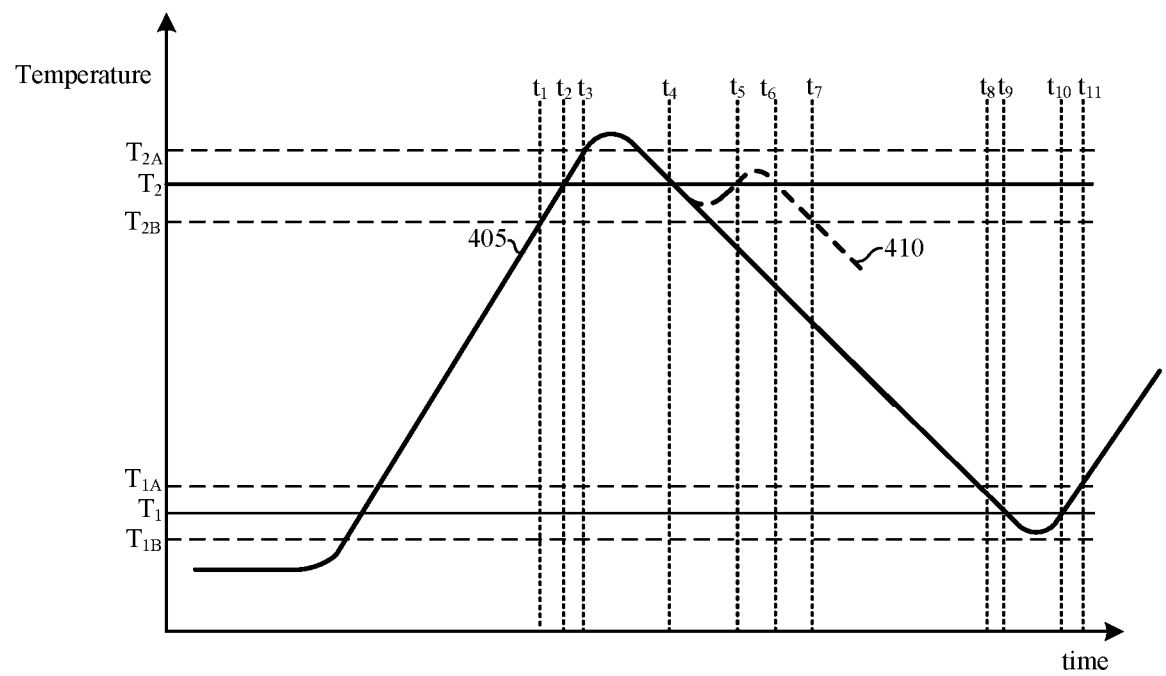
FIG. 4 illustrates an example of a temperature profile associated with temperature-based memory management as disclosed herein.

FIG. 4 illustrates an example of a temperature profile 400 associated with temperature-based memory management for a memory device 110 as disclosed herein. The temperature profile 400 may illustrate an example of a temperature 405 of the memory device 110 in the system 300 described with reference to FIG. 3. In various examples, the indicated temperature 405 may be illustrative of a temperature indicated at the memory device 110 (e.g., T1 in FIG. 3, as indicated by one or more memory device temperature sensors 320), a temperature indicated at the host device 305 (e.g., T2 in FIG. 3, as indicated by one or more host device temperature sensors 330), a temperature indicated at the coupling component 310 (e.g., T3, as indicated by one or more coupling component temperature sensors 350), or some combination thereof. In some examples, the indicated temperature 405 may be illustrative of an average indicated temperature of a set of temperature sensors, a minimum indicated temperature of a set of temperature sensors, a maximum indicated temperature of a set of sensors, or some other combination or operation applied to a set of temperature sensors.

In some examples, the host device 305 may determine a temperature of the memory device 110 (e.g., based on an offset (zero or non-zero) relative to the temperature of the host device 305 or coupling component 310) or may receive an indication of a temperature from the memory device 110. The host device 305 may then determine a value of a parameter (or set of parameters) or adjust the value of the parameter (or set of parameters) based on the temperature of the memory device 110. The host device 305 may transmit signaling based on the determined value of the parameter (or determined values for the sets of parameters).

In some cases, one or more characteristics of the signaling, such as the timing (e.g., scheduling, absolute timing, or timing relative to other signaling) or the voltage of the signaling, may be based on the parameter. Thus, the host device 305 may operate or control one or more aspects of the operation of the memory device 110 based on the determined value of the parameter (or determined values for the sets of parameters). Additionally or alternatively, the signaling may indicate the determined value of the parameter (or determined values for the sets of parameters). For example, the host device 305 may transmit (e.g., via the signaling) one or more indications of the determined values of the one or more parameters to the memory device 110, and the memory device 110 may thereafter operate in accordance therewith. For example, the signaling may cause parameter values to be stored in one or more mode registers of the memory device 110, and the memory device 110 may thereafter operate in accordance therewith. As another example, the host device 305 may transmit (e.g., via the signaling) one or more indications of the determined values of the one or more parameters to another aspect of a system 100, or otherwise adjust the operation of another aspect of a system 100 based on the determined value of the parameter (or determined values for the sets of parameters) so as to correspondingly adjust the operation of the memory device 110. For example, the host device 305 may adjust the operation of a power supply for the memory device 110 to adjust a supply voltage for the memory device 110.

In some examples, the functioning characteristics of a memory device 110 (e.g., propagation speeds or resistances of materials within the memory device 110, leakage rates of memory cells 205 within the memory device 110) may vary with the temperature of the memory device 110. In FIG. 4, as the temperature 405 increases or decreases, different operating parameters may be adjusted (e.g., values of one or more operating parameters may be selected or changed) to improve or maintain one or more desired performance characteristics of the memory device 110 and thereby compensate for, take advantage of, or mitigate the impact of changes in the temperature 405.

T1 and T2 may be examples of threshold temperatures. T1 and T2 may each represent a boundary (upper limit or lower limit) of a range of temperatures. For example, a first range of temperatures may be below T1, a second range of temperatures may be between T1 and T2, and a third range of temperatures may be above T2. It is to be understood that that any quantity of temperature ranges and associated boundaries may exist but may not be illustrated to avoid obfuscating the disclosure. In some cases, the host device 305 may determine the value of one or more operating parameters for the memory device 110 based on (e.g., at the time of or in response to) the temperature 405 reaching (crossing) either of T1 or T2. That is, in some cases, T1 and T2 may be transition points (thresholds) at which the value of one or more operating parameters may change (be determined).

In some cases, hysteresis may be introduced by the host device 305, which may beneficially avoid an undesired quantity of (frequency of) changes in parameter values, such as when temperature 405 remains at or near either T1 or T2 for a duration (e.g., an extended duration) of time. For example, temperatures $T_{1A}$ and $T_{1B}$ and temperatures $T_{2A}$ and $T_{2B}$ may be boundary temperatures above and below temperatures $T_1$ and $T_2$, respectively. For example, the host device 305 may use boundary temperatures $T_{1A}$ and $T_{2A}$ as transition points (thresholds) at which the value of one or more operating parameters may change (be determined) when temperature 405 is increasing, and the host device 305 may use boundary temperatures $T_{1B}$ and $T_{2B}$ as transition points (thresholds) at which the value of one or more operating parameters may change (be determined) when temperature 405 is decreasing. Thus, a transition point (threshold) temperature used by the host device 305 may depend on a direction of change in the temperature 405 of the memory device 110, the host device 305 may identify (e.g., determine) the transition point (threshold) based on whether a value of temperature 405 is greater than or less than a prior value of temperature 405. In some examples, T1 and T2 may not be stored or may otherwise not be utilized by the host device 305. For example, boundary temperatures $T_{1A}$ and $T_{2A}$ may be (e.g., may be stored and utilized as) boundaries (lower and upper limits) for a corresponding temperature range when temperature 405 is increasing, and boundary temperatures $T_{1B}$ and $T_{2B}$ may be (e.g., may be stored and utilized as) boundaries (lower and upper limits) for the corresponding temperature range when temperature 405 is decreasing.

In some cases, the host device 305 may store sets of parameter values in association with corresponding temperature ranges. For example, the host device 305 may store a look-up table or other data structure that associates (links) values of operating parameters for the memory device 110 to ranges of the temperature 405 of the memory device 110. Thus, in some cases, the host device 305 may determine a value of a parameter for operating the memory device 110 by determining the temperature range that correspond to (e.g., includes) a most recently sensed, indicated, or otherwise determined temperature 405 of the memory device 110 and determining the value as equal to a value associated with the identified temperature range. In some cases, determining that the temperature 405 is within a temperature range may include comparing the temperature 405 to one or more operative thresholds (transition points). In some cases, the look-up table or other data structure that associates (links) values of operating parameters for the memory device 110 to ranges of the temperature 405 of the memory device 110 may be stored in a BIOS component 125, which may, in some cases, be or include a video basic input/basic output (VBIOS) component. In some cases, the look-up table may be stored in a cache or other relatively low-latency memory at the host device 305.

In some examples, as the temperature changes, the host device 305 may select adjusted operating parameters (e.g., timing, voltage, or frequency parameters). For example, refresh rates may be increased as temperature increases (e.g., due to increased leakage rage) and thereby improve reliability or other performance aspects, and may be decreased as temperature decreases (e.g., due to decreased leakage rates) and thereby improve power consumption or other performance aspects. In some cases, the timing of commands or other signaling between the host device 305 and the memory device 110 may be adjusted based on selecting adjusted timing parameters (e.g., the timing of refresh commands sent by the host device 305 to the memory device 110 may be adjusted to be more or less frequent). Additionally or alternatively, signaling between the host device 305 and the memory device 110 may indicate adjusted timing parameters (e.g., the signaling may indicate an adjusted self-refresh schedule or row multiplier for refresh operations to be used by the memory device 110). In some cases, aligning refresh rate to temperature may improve (optimize) power consumption (e.g., fewer refreshes may reduce power consumption, so lowering the refresh rate at lower temperatures may reduce power consumption at lower temperature).

As another example, signaling between the host device 305 and the memory device 110 may be based on (e.g., be transmitted at one or more times based on) or indicate adjusted (e.g., increased or decreased) timings (e.g., core timings). For example, in some cases, the host device 305 may determine a write recovery time (tWR) based on the temperature 405, which may refer to a quantity of clock cycles between the issuance of a write command for a row and the issuance of a precharge command for the row. Thus, the elapsed time or interval between a write command and a precharge command, or the elapsed time or interval between other commands (e.g., specified by one or more other timing parameters) may be based on the temperature 405. A person of ordinary skill in the art will appreciate that while some timing parameters may be increased at lower temperatures (e.g., tWR), other timing parameters may be decreased at lower temperatures (e.g., access time).

In some examples, as the temperature 405 changes, one or more voltages used for operating the memory device 110 may be adjusted. For example, as the temperature 405 increases, a supply (e.g., external supply) or other voltage for the memory device 110 may be reduced until the temperature cools sufficiently (e.g., to below a threshold temperature or a boundary temperature as discussed herein). In some examples, the adjusted voltage may be one or more internal voltages to the memory device 110, such as reference voltages, bias voltages, or other voltages.

In some examples, as the temperature 405 changes, one or more frequencies for operating the memory device 110 (e.g., oscillator frequencies) may be adjusted. For example, the memory device frequency may be reduced as the temperature 405 increases (e.g., if the temperature 405 crosses a boundary temperature), which may prevent the memory device 110 from overheating.

In some examples, the host device 305 may determine that the memory device temperature may be in a range of temperatures. The range of temperatures may be compared to a range of parameters such as, in a look-up table at the host device 305, to determine whether one of the parameters may be adjusted. In some examples, because the memory device temperature is compared to a range of temperatures, the parameters may not be adjusted each time the memory device temperature fluctuates by some amount within a range.

In the example of FIG. 4, temperature 405 may increase from below temperature $T_1$ to above temperature $T_2$. In some cases, as the temperature 405 crosses threshold temperature $T_1$, parameter values may not be adjusted until the temperature 405 crosses the boundary temperature $T_{1A}$, and as the temperature 405 crosses threshold temperature $T_2$, parameter values may not be adjusted until the temperature 405 crosses the boundary temperature $T_{2A}$. Once the temperature crosses the boundary temperature $T_{2A}$, the values of one or more operating parameters may be adjusted. In other cases, threshold temperatures $T_1$ and $T_2$ may act as transition points.

Following temperature profile 400, after increasing beyond threshold temperature $T_2$ and boundary temperature $T_{2A}$, the temperature 405 may subsequently decrease. In some cases, parameter values may not be adjusted until temperature 405 crosses the boundary temperature $T_{2B}$. In other cases, parameter values may be adjusted when temperature 405 crosses the threshold temperature $T_2$.

In some examples, temperature 405 may initially cross boundary temperature $T_{2B}$ at time $t_1$. Because $T_{2B}$ is the lower boundary limit and the temperature 405 is increasing at time $t_1$, parameter value may not be adjusted. The temperature 405 may then cross the threshold temperature $T_2$ at time $t_2$. As previously discussed, in some cases, even though the threshold temperature $T_2$ may nominally define a boundary of a temperature range, it may not, in some cases, act as a transition point, and parameters values may not instead be adjusted based on the upper boundary temperature $T_{2A}$ of the threshold temperature $T_2$. At time $t_3$, temperature 405 may cross the upper boundary temperature $T_{2A}$. At this time, the host device 305 may determine that the memory device parameters may be adjusted.

Similarly, as temperature 405 decreases and crosses the threshold temperature $T_2$ at time $t_4$, parameter values may not be adjusted.

In some examples, the temperature may fluctuate around the threshold temperature as shown in temperature 410. As previously discussed, parameter values may not be adjusted to prevent the values from being changed rapidly, as excessive changes may introduce additional overhead, which may in turn increase latency or otherwise impact memory device operations. Even though temperature 410 crosses the threshold temperature $T_2$ multiple times, for example at times $t_5$ and $t_6$, parameter values for operating the memory device 110 may not be adjusted at these times as temperature 410 may not cross a boundary temperature. At time $t_7$, the temperature 410 may cross the boundary temperature $T_{2B}$, and parameter values may be adjusted.

In some examples, temperature 405 may continue to decrease and may cross boundary temperature $T_{1A}$ at time $t_8$, the threshold temperature at time $t_9$, switch directions to once again cross the threshold temperature at time $t_{10}$, and then increase to cross the boundary temperature $T_{1A}$ at time $t_{11}$. Even though the temperature 405 crossed the boundary temperature and the threshold temperature $T_1$ multiple times, the host device 305 may determine to not change the value of one or more memory device parameters.

In various examples of the techniques described with reference FIGS. 3 through 5, any one or more of the described thresholds (e.g., $T_{1B}$, $T_1$, $T_{1A}$ $T_{2B}$ $T_2$, $T_{2A}$) may be configured, identified, or determined according to various techniques. For example, any one or more of the thresholds may be configured at a device (e.g., as a static value or level or a set of static values or levels at a memory device 110, as a static value or level or set of static values or levels at a host device 305), which may be stored in a mode register, trim parameters, or one or more non-volatile storage elements (e.g., fuses, anti-fuses) of the respective device that are configured to store an indication of one or more configurations or thresholds of the respective device. In various examples, the memory device 110 or the host device 305 may identify a configuration (e.g., a configured threshold) by accessing such non-volatile storage elements.

Additionally or alternatively, any one or more of the thresholds may be determined or identified at a device as specific to one or more operating parameter of the device (e.g., a voltage, frequency, timing). In some examples, any one or more of the thresholds may be determined or identified at a device based at least in part on operating conditions of the device. For example, when the indicated temperature 405 experiences rapid fluctuations, the boundary temperature $T_{2A}$ may be set relatively higher (e.g., a wider hysteresis band), or the boundary temperature $T_{2B}$ may be set relatively lower, or both.

The described comparisons or evaluations of the indicated temperatures (e.g., indicated temperatures 405 or 505) with various thresholds may be performed by one or both of the memory device 110 or the host device 305 according to various techniques, which may include operations performed at a device memory controller 155 or an external memory controller 105. For example, when an indicated temperature is represented in the digital domain at the memory device 110 or the host device 305, such comparisons may be performed in the digital domain at a processor or digital comparator (e.g., as a comparison of binary values, as a comparison of integer values, as a comparison of floating point values). When an indicated temperature is represented in the analog domain at the memory device 110 or the host device 305 (e.g., as a voltage of a thermocouple, as a voltage or current across an RTD), such comparisons may be performed in the analog domain at a processor, a comparator, a transistor (e.g., between a gate and source or drain node), or other circuitry (e.g., as a comparison of a voltage against a reference voltage indicative of a threshold, as a comparison of a current against a reference current indicative of a threshold). Further, while the example of FIG. 4 may illustrate the use of hysteresis, one of ordinary will may appreciate that hysteresis need not be used in all cases or for all parameters.

Figure 5:
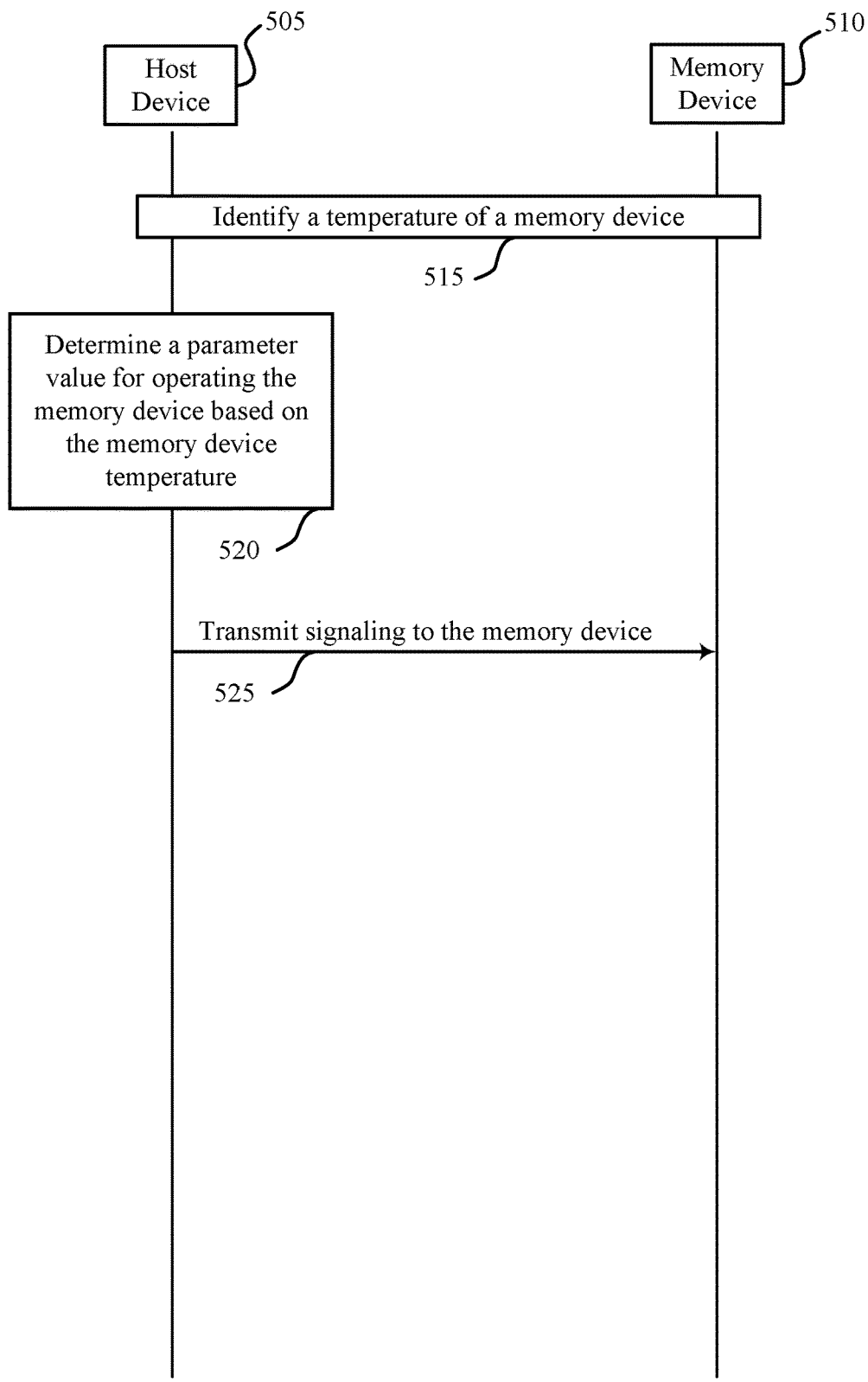
FIG. 5 illustrates an example of a communication scheme that supports temperature-based memory management as disclosed herein.

FIG. 5 illustrates an example of a communication scheme 500 associated with temperature-based memory management as disclosed herein. The communication scheme 500 may illustrate an example of identifying a temperature of a memory device 110 and determining a parameter value based on the memory device temperature as described with reference to FIGS. 3 and 4.

The communication scheme 500 includes functions performed by and communications exchanged between a host device 505 and a memory device 510. The host device 505 and the memory device 510 may be examples of the host device 305 and the memory device 110 as discussed with reference to FIGS. 3 and 4.

At block 515, a temperature of the memory device 510 may be identified. The memory device temperature may be determined by the host device 505 based on the host device temperature or the host device 505 may request and receive an indication of the temperature from the memory device 510. In some examples, the host device 505 may use an offset between the host device temperature and the memory device temperature to identify the memory device temperature. In some examples, the host device 505 may request the memory device temperature from the memory device 510 (e.g., based on the host device detecting a change in the host device temperature) and the memory device 510 may transmit the memory device temperature to the host device 505.

At block 520, a parameter value may be determined for memory device operation and the parameter value may be based on the memory device temperature. As previously discussed, the host device 505 may determine a value of a parameter for operating the memory device such as a timing parameter, a voltage parameter, a frequency parameter, and so forth, or any combination thereof, from the memory device temperature. In some examples, the host device 505 may determine that the memory device temperature falls within a range of temperatures and then select one or more parameter values corresponding to the range of temperatures.

After determining the parameter value for operating the memory device, at block 525, the host device 505 may transmit the signaling to the memory device 510 based on the parameter value. In some examples, a time, voltage, or other characteristic of the signaling 525 as communicated from the host device 505 to the memory device 510 may be based on one or more parameters determined at 520. In some examples, an absolute time of transmission for the signaling 525 may be based on one or more timing parameters determined at 520. In some examples, an interval of time between transmissions included in the signaling 525 may be based on one or more timing parameters determined at 520. For example, the timing of one or more refresh commands or of one or more access commands (e.g., write command or read command) may be based on one or more timing parameters determined at 520. In some cases, the signaling at 525 may indicate an updated value of a parameter to the memory device 510. The memory device 510 may store the updated value of the parameter (e.g., in a mode register at the memory device 510).

Figure 6:
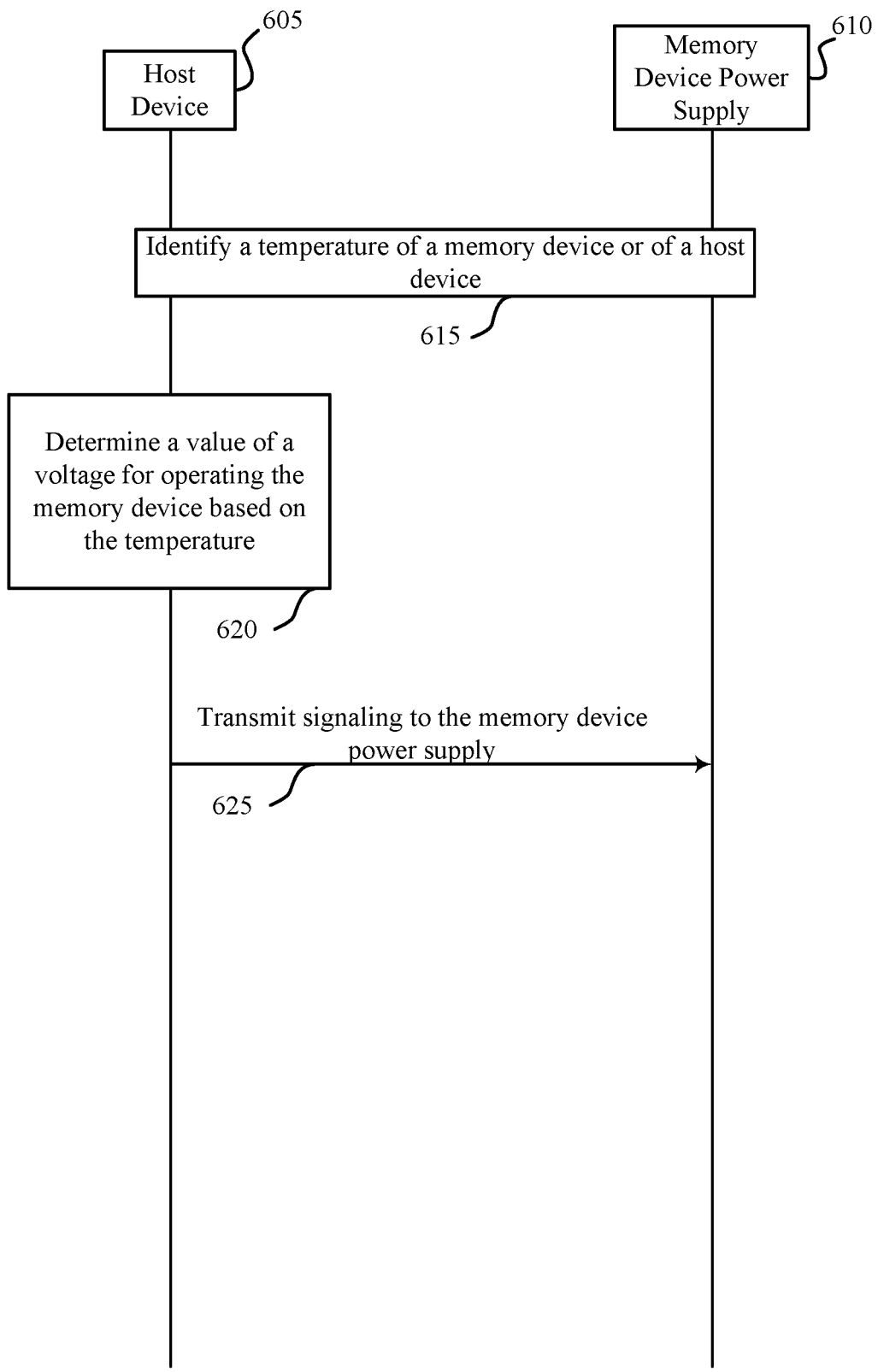
FIG. 6 illustrates an example of a communication scheme that supports temperature-based memory management as disclosed herein.

FIG. 6 illustrates an example of a communication scheme 600 associated with temperature-based memory management as disclosed herein. The communication scheme 600 may illustrate an example of identifying a temperature of a memory device 110 and adjusting a voltage value based on the memory device temperature as described with reference to FIGS. 3 and 4.

The communication scheme 600 includes functions performed by and communications exchanged between a host device 605 and a memory device power supply 610. The host device 605 may be an example of the host device as discussed with reference to FIGS. 3 and 4.

At block 615, a temperature of a memory device 110 (not shown in FIG. 6) may be identified. The memory device temperature may be determined by the host device 605 based on the host device temperature or the host device 605 may request and receive an indication of the temperature from the memory device 110. In some examples, the host device 605 may use an offset between the host device temperature and the memory device temperature to identify the memory device temperature. In some examples, the host device 605 may request the memory device temperature from the memory device 110 (e.g., based on the host device 605 detecting a change in the host device temperature) and the memory device 110 may transmit the memory device temperature to the host device 605.

At block 620, a voltage value may be determined for operating the memory device 110 based on the temperature. In some examples, as the temperature of the memory device 110 changes, the voltage may be adjusted to account for the operating speed of the memory device. For example, as the temperature of the memory device rises, the voltage may be adjusted (e.g., reduced) to prevent the memory device from overheating. After the voltage value is determined, at block 625, the host device 605 may transmit the signaling to the memory device power supply 610 or otherwise transmit signaling to adjust the supply voltage provided to the memory device 110 by the memory device power supply 610.

Figure 7:
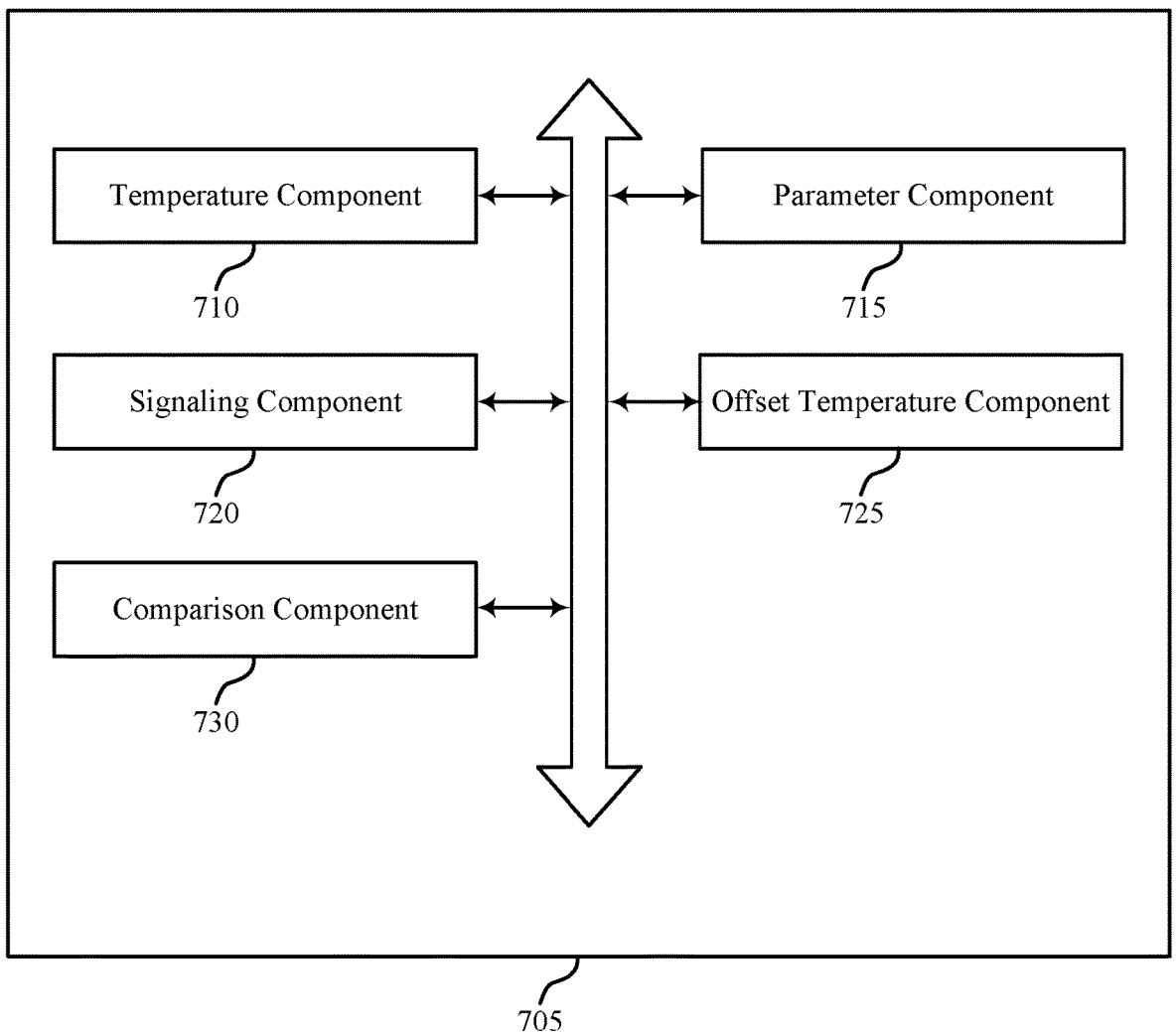
FIG. 7 shows a block diagram of a system that supports temperature-based memory management as disclosed herein.

FIG. 7 shows a block diagram 700 of a system 705 that supports temperature-based memory management in accordance with aspects of the present disclosure. The system 705 may be an example of aspects of a device (e.g., a host device) as described with reference to FIGS. 1 through 6. The system 705 may include a temperature component 710, a parameter component 715, a signaling component 720, an offset temperature component 725, and a comparison component 730. Each of these components may communicate, directly or indirectly, with one another (e.g., via one or more buses).

The temperature component 710 may identify a temperature of a memory device. In some examples, the temperature component 710 may receive, from the memory device, an indication of the temperature of the memory device, where identifying the temperature of the memory device is based on the indication. In some examples, the temperature component 710 may determine a change in temperature of a host device or other device (e.g., cooling component) coupled with the memory device and request the temperature indication from the memory device based on the change in temperature. In some examples, the temperature component 710 may sense a temperature of a host device or other device (e.g., cooling component) coupled with the memory device, where identifying the temperature of the memory device is based on sensing the temperature of the host device or other device. In some examples, the range of temperatures has an upper limit and a lower limit, and at least one of the upper limit or the lower limit has a first value for a first direction of temperature change for the memory device and a second value for second direction of temperature change for the memory device. In some examples, the temperature component 710 may determine that the temperature of the memory device is within a range of temperatures. In some examples, the temperature component 710 may determine a second temperature of the memory device.

The parameter component 715 may determine a value of a parameter for operating the memory device based on the temperature of the memory device as identified by the host device (e.g., based on the temperature of the memory device falling below a threshold). In some examples, the parameter component 715 may determine a second value of the parameter for operating the memory device based on comparing the second temperature of the memory device to a second threshold. In some examples, the parameter component 715 may store the value of the parameter at the memory device. In some examples, the parameter component 715 may store sets of values of the parameters, where each set of values is associated with a respective range of temperatures. In some examples, the parameter component 715, may store sets of values for the parameters in a BIOS. In some examples, the parameter component 715, may store sets of values for the parameters in a look-up table.

The parameter component 715 may determine values of parameters for operating the memory device based on a range of temperatures that includes the temperature of the memory device. In some examples, determining a set of values for a corresponding set of parameters for operating the memory device based on the range of temperatures, where the set of values includes the value of the parameter. The parameter component 715 may select a set of values from the set for which the respective range of temperatures corresponds to the temperature of the memory device, where the determined values for the parameters include the selected set of values.

In some cases, the parameter includes a timing, frequency, or voltage parameter for the memory device. In some examples, the parameter component 715 may determine a value of a voltage for operating the memory device based on the temperature. In some cases, the parameter includes a refresh rate and the command includes a refresh command. In some cases, the parameter includes a write recovery time (tWR) and the command includes a precharge command. In some cases, the parameter includes a voltage for operating the memory device and the signaling includes an indication of the voltage. In some cases, the parameter includes a frequency for operating the memory device and the signaling includes an indication of the frequency. The host device may thus adjust the frequency of the memory device according to the temperature of the memory device.

The signaling component 720 may transmit signaling to the memory device based on the value of the parameter. In some examples, the signaling component 720 may transmit signaling to the memory device based on the determined values of the parameters. In some examples, the signaling component 720 may transmit signaling to the memory device based on the second value of the parameter.

The signaling component 720 may transmit a command to the memory device at a time that is based on the value of the parameter, where the signaling based on the value of the parameter includes the command. In some examples, the signaling component 720 may transmit a command to the memory device at a time that is determined based on the temperature of the memory device. The signaling component 720 may transmit a first command and a second command to the memory device, where a quantity of time between the first command the second command is based on the value of the parameter, and where the signaling includes the first command and the second command.

In some examples, the signaling component 720 may transmit, to the memory device based on the change in temperature of the host device, a request for the indication of the temperature of the memory device.

In some examples, the signaling component 720 may transmit signaling to a power supply for the memory device based on the value of the voltage. In some examples, the signaling to the power supply may indicate the value of the voltage.

The offset temperature component 725 may identify an offset between the temperature of the host device and the temperature of the memory device, where identifying the temperature of the memory device is based on the offset.

The comparison component 730 may compare the temperature of the memory device to the threshold, where determining the value of the parameter for operating the memory device is based on the comparison (e.g., based on determining that the temperature of the memory device is below the threshold). In some examples, the comparison component 730 may identify the second threshold based on whether the second temperature of the memory device is above or below the temperature.

In some cases, the memory device includes cells having capacitive storage elements (e.g., capacitors).

Figure 8:
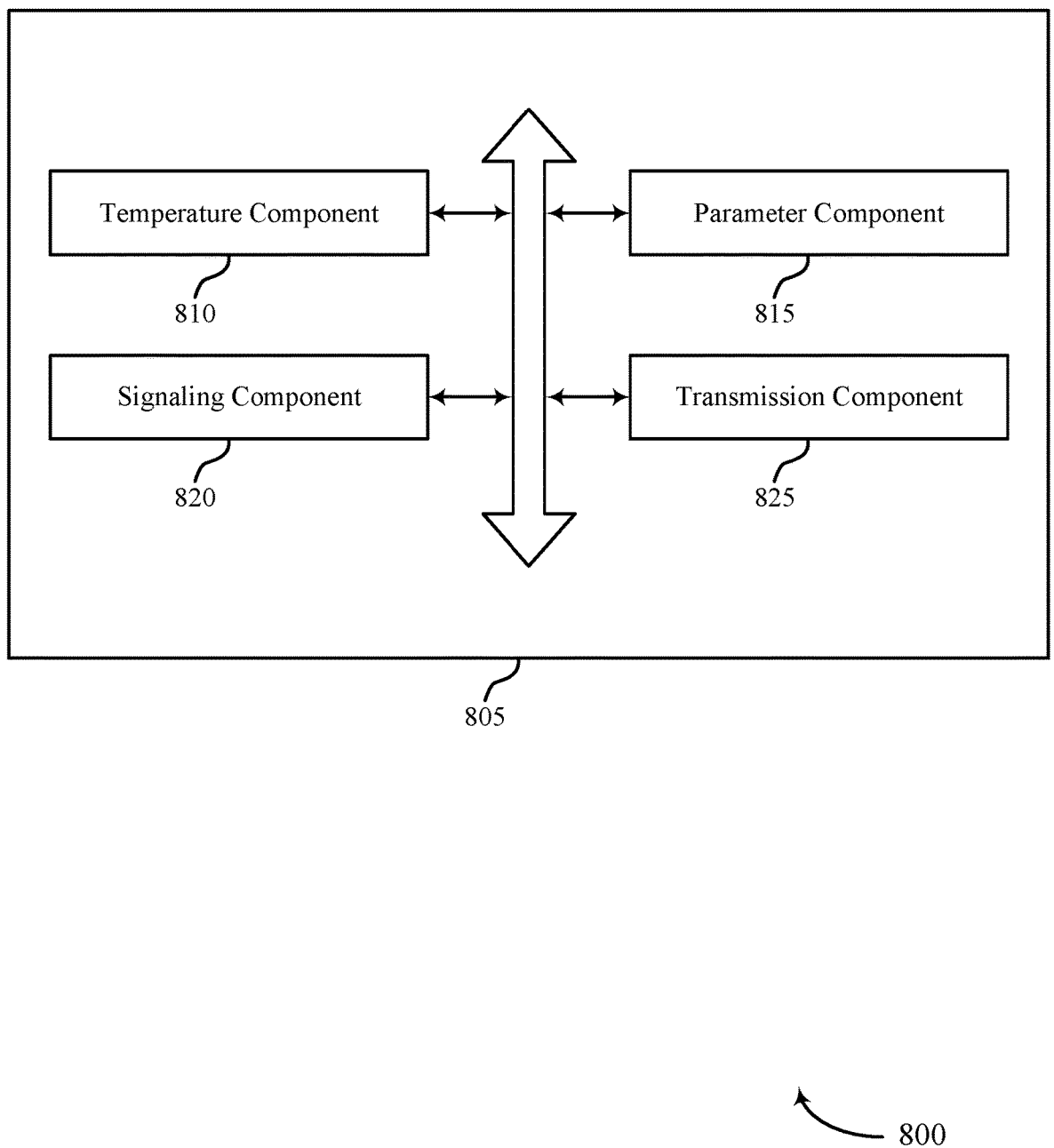
FIG. 8 shows a block diagram of a system that supports temperature-based memory management as disclosed herein.

FIG. 8 shows a block diagram 800 of a system 805 that supports temperature-based memory management in accordance with aspects of the present disclosure. The system 805 may be an example of aspects of a device (e.g., a memory device) as described with reference to FIGS. 1 through 6. The system 805 may include a temperature component 810, a parameter component 815, a signaling component 820, and a transmission component 825. Each of these modules may communicate, directly or indirectly, with one another (e.g., via one or more buses).

In some examples, the temperature component 810 may receive, from a host device at a memory device, a request for an indication of a temperature of the memory device. The temperature component 810 may include a temperature sensor, which may, in some cases, be included in (e.g., embedded in or fabricated in) a die within the memory device. In some examples, the temperature component 810 may determine the temperature of the memory device based on a sensor internal to the memory device.

The transmission component 825 may transmit, from the memory device to the host device, the indication of the temperature of the memory device.

In some examples, the signaling component 820 may receive, at the memory device, signaling from the host device based on the temperature of the memory device (e.g., based on the temperature of the memory device falling below a threshold). The signaling component 820 may receive, at the memory device, a command from the host device at a time based on the temperature of the memory device, where the signaling includes the command. In some examples, the signaling component 820 may receive, at the memory device, a first command and a second command from the host device, where an elapsed time between the first command the second command is based on the temperature of the memory device, and where the signaling includes the first command and the second command.

In some examples, the parameter component 815 may receive, at the memory device, an indication of a value of a parameter for operating the memory device, where the value of the parameter is based on the temperature of the memory device, and where the signaling includes the indication of the value of the parameter.

In some cases, the memory device includes cells having capacitive storage elements (e.g., capacitors). In some cases, the parameter includes a timing, frequency, or voltage parameter for the memory device.

Figure 9:
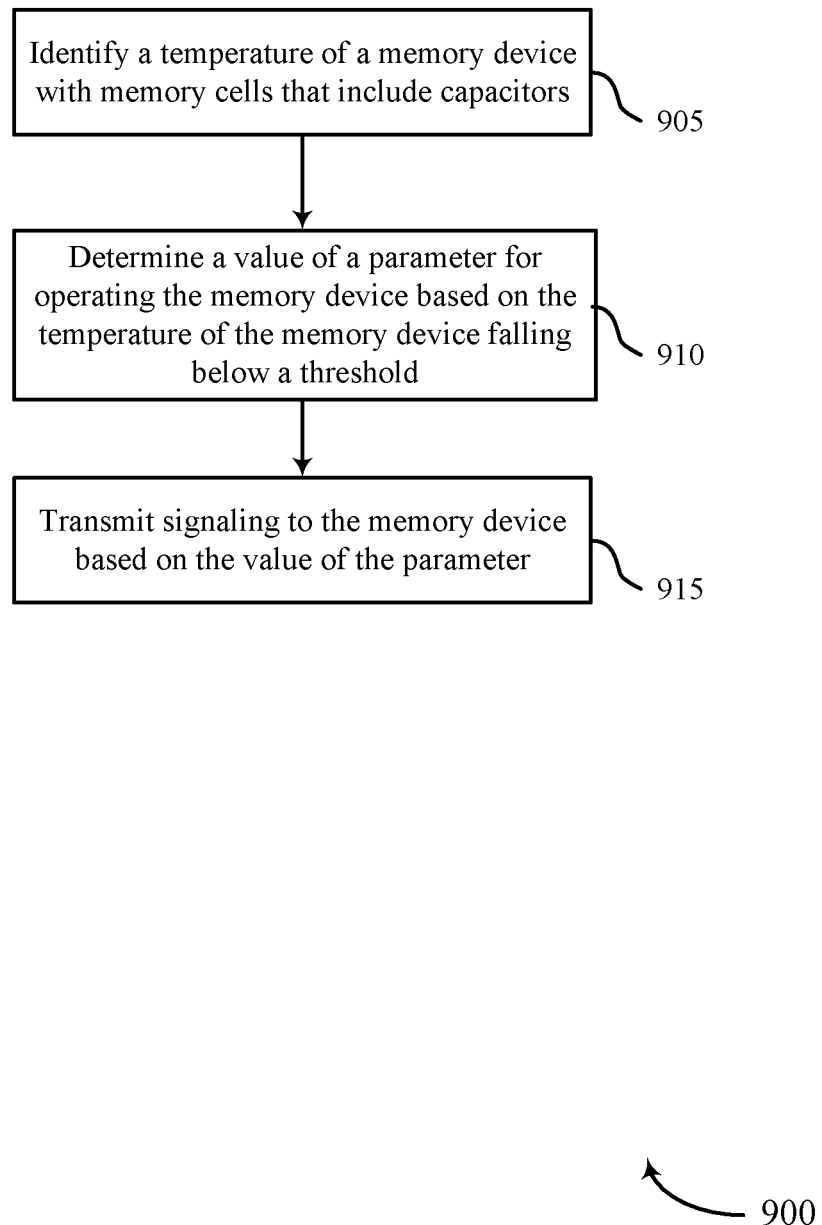
FIGS. 9 through 14 show flowcharts illustrating a method or methods that support temperature-based memory management as disclosed herein.

FIG. 9 shows a flowchart illustrating a method 900 that supports temperature-based memory management in accordance with aspects of the present disclosure. The operations of method 900 may be implemented by an external memory controller 105 or host device 305, a system 100, or various components of an external memory controller 105, or a system 100, as described with reference to FIGS. 1 through 8. In some examples, an external memory controller 105, or a system 100 may execute a set of instructions to control the functional elements of the external memory controller 105, or the system 100 to perform the described functions. Additionally or alternatively, an external memory controller 105, or a system 100 may perform aspects of the described functions using special-purpose hardware or circuitry.

At 905, the controller may identify a temperature of a memory device (e.g., a memory device with memory cells that include capacitors). The operations of 905 may be performed according to the methods described herein. In some examples, aspects of the operations of 905 may be performed by a temperature component as described with reference to FIGS. 7 and 8.

At 910, the controller may determine a value of a parameter for operating the memory device based on the temperature of the memory device (e.g., based on the temperature of the memory device falling below a threshold). The operations of 910 may be performed according to the methods described herein. In some examples, aspects of the operations of 910 may be performed by a parameter component as described with reference to FIGS. 7 and 8.

At 915, the controller may transmit signaling to the memory device based on the value of the parameter. The operations of 915 may be performed according to the methods described herein. In some examples, aspects of the operations of 915 may be performed by a signaling component as described with reference to FIGS. 7 and 8.

An apparatus is described. The apparatus may include means for identifying a temperature of a memory device (e.g., a memory device with memory cells that include capacitors), means for determining a value of a parameter for operating the memory device based on the temperature of the memory device (e.g., based on the temperature of the memory device falling below a threshold), and means for transmitting signaling to the memory device based on the value of the parameter.

Another apparatus is described. The apparatus may include a controller or circuitry configured to cause the apparatus to identify a temperature of a memory device (e.g., a memory device that include capacitors), determine a value of a parameter for operating the memory device based on the temperature of the memory device (e.g., based on the temperature of the memory device falling below a threshold), and transmit signaling to the memory device based on the value of the parameter.

Some examples of the method or apparatuses may further include operations, features, means, or instructions for transmitting a command to the memory device at a time that may be based on the value of the parameter, where the signaling based on the value of the parameter includes the command.

In some examples of the method or apparatuses, the parameter includes a refresh rate and the command includes a refresh command.

In some examples of the method or apparatuses, the parameter includes a write recovery time (tWR) and the command includes a precharge command.

Some examples of the method or apparatuses may further include operations, features, means, or instructions for transmitting a first command and a second command to the memory device, where a quantity of time between the first command the second command may be based on the value of the parameter, and where the signaling includes the first command and the second command.

In some examples of the method or apparatuses, the parameter includes a voltage for operating the memory device and the signaling includes an indication of the voltage.

In some examples of the method or apparatuses, the parameter includes a frequency for operating the memory device and the signaling includes an indication of the frequency.

Some examples of the method or apparatuses may further include operations, features, means, or instructions for determining that the temperature of the memory device may be within a range of temperatures, and determining a set of values for a corresponding set of parameters for operating the memory device based on the range of temperatures, where the set of values includes the value of the parameter.

Some examples of the method or apparatuses may further include operations, features, means, or instructions for comparing the temperature of the memory device to the threshold, where determining the value of the parameter for operating the memory device may be based on the comparison (e.g., based on determining that the temperature of the memory device is below the threshold).

Some examples of the method or apparatuses may further include operations, features, means, or instructions for determining a second temperature of the memory device, determining a second value of the parameter for operating the memory device based on comparing the second temperature of the memory device to a second threshold, and transmitting signaling to the memory device based on the second value of the parameter.

Some examples of the method or apparatuses may further include operations, features, means, or instructions for identifying the second threshold based on whether the second temperature of the memory device may be above or below the temperature identified at 905.

Figure 10:
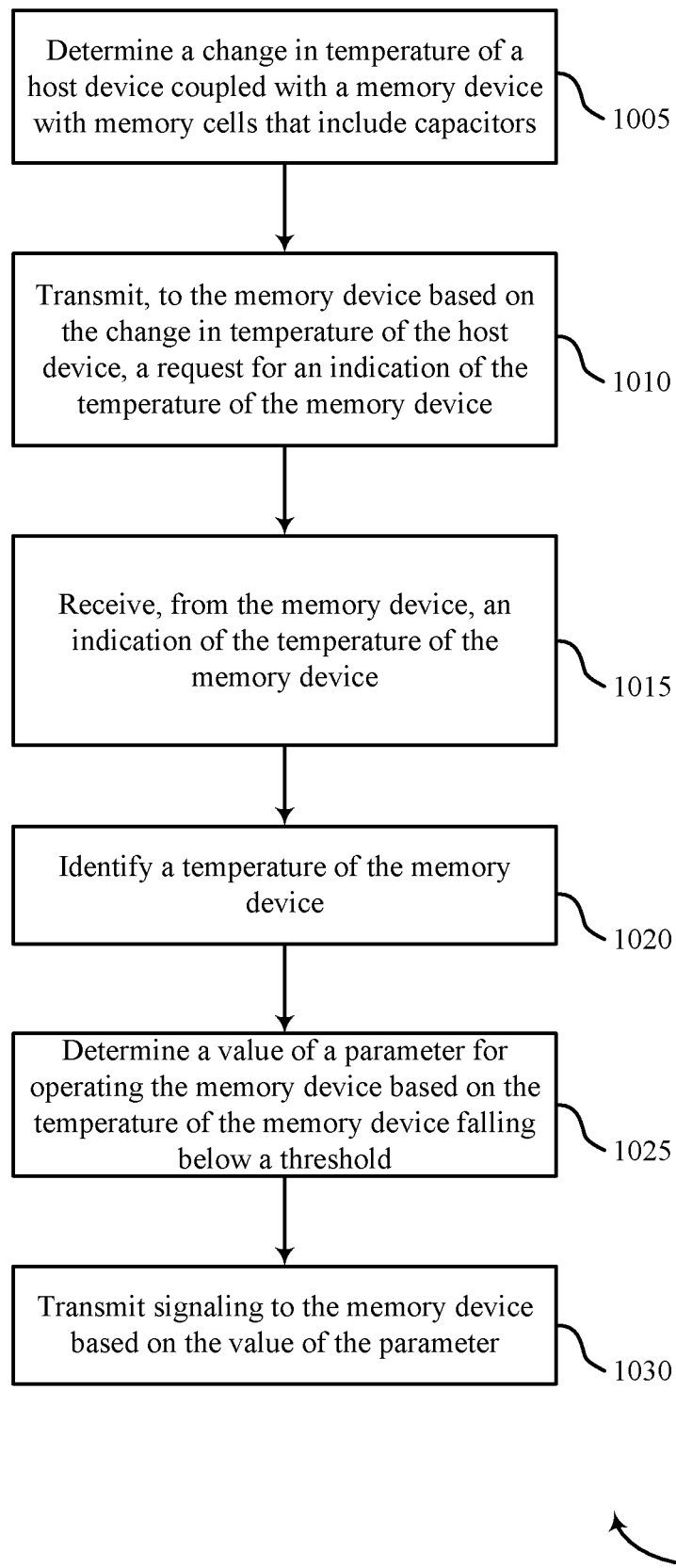

FIG. 10 shows a flowchart illustrating a method 1000 that supports temperature-based memory management in accordance with aspects of the present disclosure. The operations of method 1000 may be implemented by an external memory controller 105 or host device 305, a system 100, or various components of an external memory controller 105, or a system 100, as described with reference to FIGS. 1 through 8. In some examples, an external memory controller 105, or a system 100 may execute a set of instructions to control the functional elements of the external memory controller 105, or the system 100 to perform the described functions. Additionally or alternatively, an external memory controller 105, or a system 100 may perform aspects of the described functions using special-purpose hardware or circuitry.

At 1005, the controller may determine a change in temperature of a host device coupled with a memory device (e.g., a memory device with memory cells that include capacitors). The operations of 1010 may be performed according to the methods described herein. In some examples, aspects of the operations of 1005 may be performed by a temperature component as described with reference to FIGS. 7 and 8.

At 1010, the controller may transmit, to the memory device based on the change in temperature of the host device, a request for an indication of the temperature of the memory device. The request for the indication of the temperature of the memory device may be based on determining the change in temperature at 1005. The operations of 1010 may be performed according to the methods described herein. In some examples, aspects of the operations of 1010 may be performed by a transmission component as described with reference to FIGS. 7 and 8.

At 1015, the controller may receive, from the memory device, the indication of the temperature of the memory device. The operations of 1015 may be performed according to the methods described herein. In some examples, aspects of the operations of 1015 may be performed by a temperature component as described with reference to FIGS. 7 and 8.

At 1020, the controller may identify a temperature of a memory device, which may be based on the indication received at 1015. The operations of 1020 may be performed according to the methods described herein. In some examples, aspects of the operations of 1020 may be performed by a temperature component as described with reference to FIGS. 7 and 8.

At 1025, the controller may determine a value of a parameter for operating the memory device based on the temperature of the memory device (e.g., based on the temperature of the memory device falling below a threshold). The operations of 1025 may be performed according to the methods described herein. In some examples, aspects of the operations of 1025 may be performed by a parameter component as described with reference to FIGS. 7 and 8.

At 1030, the controller may transmit signaling to the memory device based on the value of the parameter. The operations of 1030 may be performed according to the methods described herein. In some examples, aspects of the operations of 1030 may be performed by a signaling component as described with reference to FIGS. 7 and 8.

Figure 11:
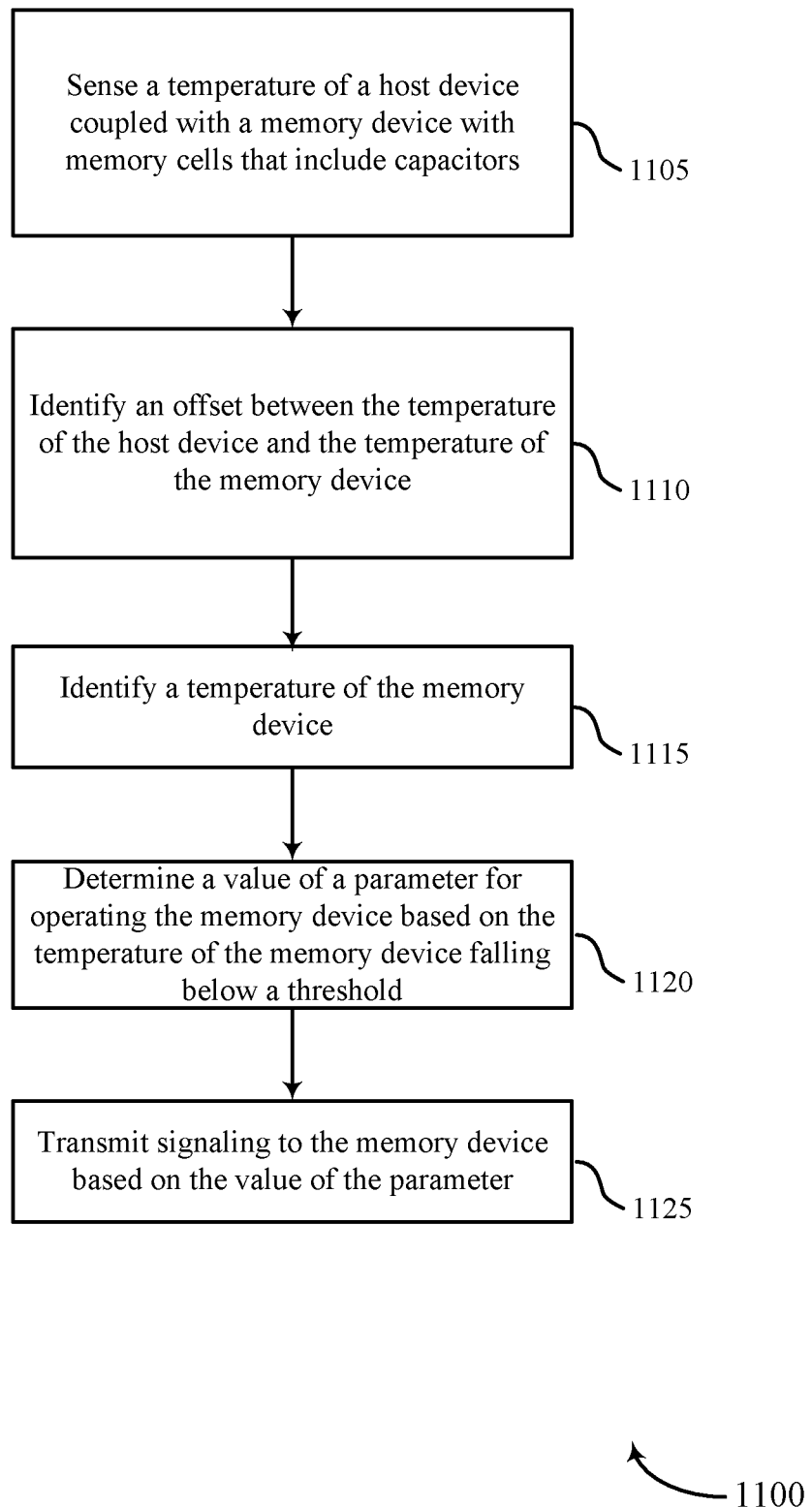

FIG. 11 shows a flowchart illustrating a method 1100 that supports temperature-based memory management in accordance with aspects of the present disclosure. The operations of method 1100 may be implemented by an external memory controller 105 or host device 305, a system 100, or various components of an external memory controller 105, or a system 100, as described with reference to FIGS. 1 through 8. In some examples, an external memory controller 105, or a system 100 may execute a set of instructions to control the functional elements of the external memory controller 105, or the system 100 to perform the described functions. Additionally or alternatively, an external memory controller 105, or a system 100 may perform aspects of the described functions using special-purpose hardware or circuitry.

At 1105, the controller may sense a temperature of a host device coupled with a memory device (e.g., a memory device with memory cells that include capacitors). The operations of 1110 may be performed according to the methods described herein. In some examples, aspects of the operations of 1110 may be performed by a temperature component as described with reference to FIGS. 7 and 8.

At 1110, the controller may identify an offset between the temperature of the host device and the temperature of the memory device. The operations of 1110 may be performed according to the methods described herein. In some examples, aspects of the operations of 1115 may be performed by an offset temperature component as described with reference to FIGS. 7 and 8.

At 1115, the controller may identify a temperature of a memory device based on sensing the temperature of the host device and the offset. The operations of 1115 may be performed according to the methods described herein. In some examples, aspects of the operations of 1115 may be performed by a temperature component as described with reference to FIGS. 7 and 8.

At 1120, the controller may determine a value of a parameter for operating the memory device based on the temperature of the memory device (e.g., based on the temperature of the memory device falling below a threshold). The operations of 1120 may be performed according to the methods described herein. In some examples, aspects of the operations of 1120 may be performed by a parameter component as described with reference to FIGS. 7 and 8.

At 1125, the controller may transmit signaling to the memory device based on the value of the parameter. The operations of 1125 may be performed according to the methods described herein. In some examples, aspects of the operations of 1125 may be performed by a signaling component as described with reference to FIGS. 7 and 8.

Figure 12:
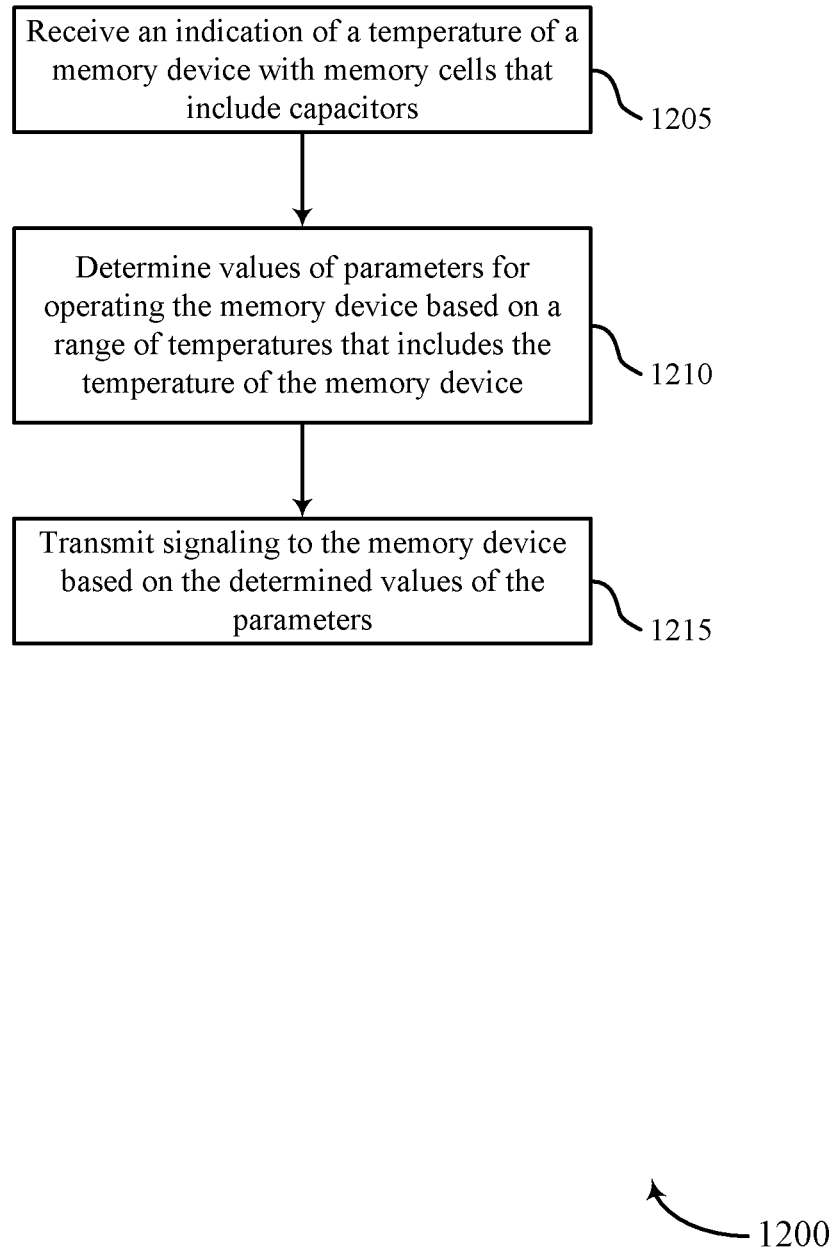

FIG. 12 shows a flowchart illustrating a method 1200 that supports temperature-based memory management in accordance with aspects of the present disclosure. The operations of method 1200 may be implemented by an external memory controller 105 or host device 305, a system 100, or various components of an external memory controller 105, or a system 100, as described with reference to FIGS. 1 through 8. In some examples, an external memory controller 105, or a system 100 may execute a set of instructions to control the functional elements of the external memory controller 105, or the system 100 to perform the described functions. Additionally or alternatively, an external memory controller 105, or a system 100 may perform aspects of the described functions using special-purpose hardware or circuitry.

At 1205, the controller may receive an indication of a temperature of a memory device (e.g., a memory device with memory cells that include capacitors). The operations of 1205 may be performed according to the methods described herein. In some examples, aspects of the operations of 1205 may be performed by a temperature component as described with reference to FIGS. 7 and 8.

At 1210, the controller may determine values of parameters for operating the memory device based on a range of temperatures that includes the temperature of the memory device (e.g., based on the temperature of the memory device falling below a threshold). The operations of 1210 may be performed according to the methods described herein. In some examples, aspects of the operations of 1210 may be performed by a determination component as described with reference to FIGS. 7 and 8.

At 1215, the controller may transmit signaling to the memory device based on the determined values of the parameters. The operations of 1215 may be performed according to the methods described herein. In some examples, aspects of the operations of 1215 may be performed by a signaling component as described with reference to FIGS. 7 and 8.

An apparatus is described. The apparatus may include means for receiving an indication of a temperature of a memory device, means for determining values of parameters for operating the memory device based on a range of temperatures that includes the temperature of the memory device, and means for transmitting signaling to the memory device based on the determined values of the parameters.

Another apparatus is described. The apparatus may include a controller or circuitry configured to cause the apparatus to receive an indication of a temperature of a memory device, determine values of parameters for operating the memory device based on a range of temperatures that includes the temperature of the memory device, and transmit signaling to the memory device based on the determined values of the parameters.

Some examples of the method or apparatuses may further include operations, features, means, or instructions for storing sets of values of the parameters, where each set of values may be associated with a respective range of temperatures, and selecting a set of values for which the respective range of temperatures corresponds to the temperature of the memory device, where the determined values for the parameters include the selected set of values.

Some examples of the method or apparatuses may further include operations, features, means, or instructions for storing sets of values for the parameters in a basic input-output system (BIOS).

In some examples of the method or apparatuses, the range of temperatures has an upper limit and a lower limit, and at least one of the upper limit or the lower limit has a first value for a first direction of temperature change for the memory device and a second value for second direction of temperature change for the memory device.

In some examples of the method or apparatuses, the memory device includes cells having capacitive storage elements (e.g., capacitors).

Figure 13:
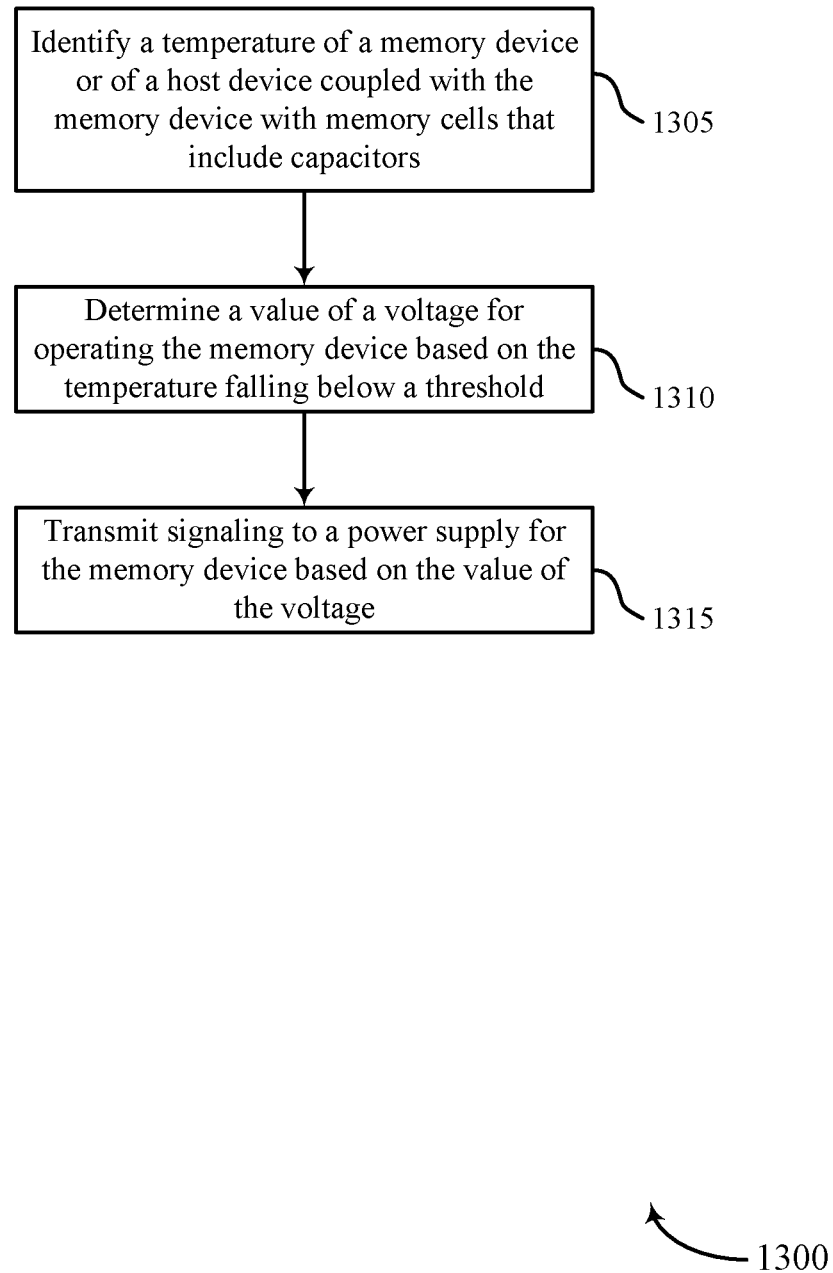

FIG. 13 shows a flowchart illustrating a method 1300 that supports temperature-based memory management in accordance with aspects of the present disclosure. The operations of method 1300 may be implemented by an external memory controller 105 or host device 305, a system 100, or various components of an external memory controller 105, or a system 100, as described with reference to FIGS. 1 through 8. In some examples, an external memory controller 105, or a system 100 may execute a set of instructions to control the functional elements of the external memory controller 105, or the system 100 to perform the described functions. Additionally or alternatively, an external memory controller 105, or a system 100 may perform aspects of the described functions using special-purpose hardware or circuitry.

At 1305, the controller may identify a temperature of a memory device or of a host device coupled with the memory device. The operations of 1305 may be performed according to the methods described herein. In some examples, aspects of the operations of 1305 may be performed by a temperature component as described with reference to FIGS. 7 and 8.

At 1310, the controller may determine a value of a voltage for operating the memory device based on the temperature (e.g., based on the temperature falling below a threshold). The operations of 1310 may be performed according to the methods described herein. In some examples, aspects of the operations of 1310 may be performed by a parameter component as described with reference to FIGS. 7 and 8.

At 1315, the controller may transmit signaling to a power supply for the memory device based on the value of the voltage. The operations of 1315 may be performed according to the methods described herein. In some examples, aspects of the operations of 1315 may be performed by a signaling component as described with reference to FIGS. 7 and 8.

An apparatus is described. The apparatus may include means for identifying a temperature of a memory device or of a host device coupled with the memory device, means for determining a value of a voltage for operating the memory device based on the temperature (e.g., based on the temperature falling below a threshold), and means for transmitting signaling to a power supply for the memory device based on the value of the voltage.

Another apparatus is described. The apparatus may include a controller or circuitry configured to cause the apparatus to identify a temperature of a memory device or of a host device coupled with the memory device, determine a value of a voltage for operating the memory device based on the temperature (e.g., based on the temperature falling below a threshold), and transmit signaling to a power supply for the memory device based on the value of the voltage.

In some examples of the method or apparatuses, the signaling to the power supply indicates the value of the voltage.

Some examples of the method or apparatuses may further include operations, features, means, or instructions for transmitting a command to the memory device at a time that may be determined based on the temperature of the memory device.

In some examples of the method or apparatuses, the memory device includes cells having capacitive storage elements (e.g., capacitors).

Figure 14:
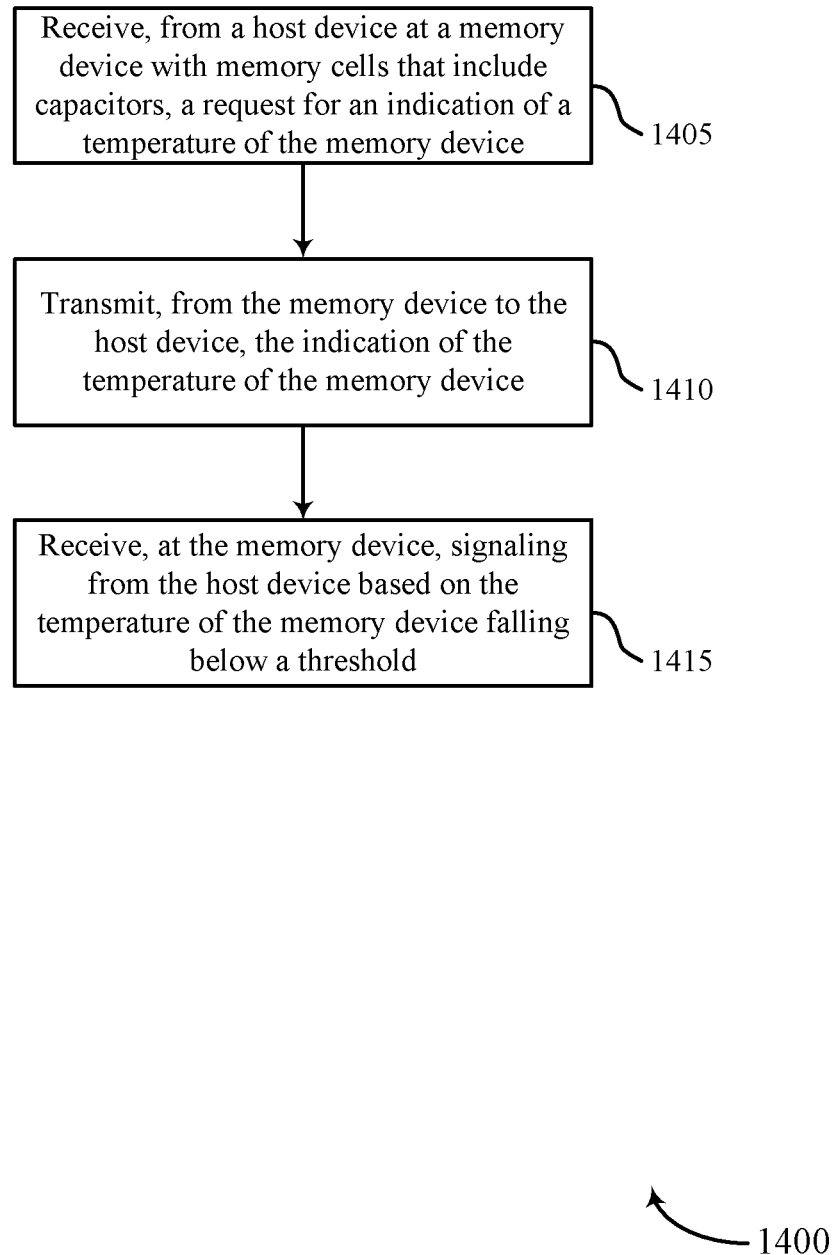

FIG. 14 shows a flowchart illustrating a method 1400 that supports temperature-based memory management in accordance with aspects of the present disclosure. The operations of method 1300 may be implemented by a memory device 110, or various components of a memory device 110, or a system 100, as described with reference to FIGS. 1 through 8. In some examples, a memory device 110, or a system 100 may execute a set of instructions to control the functional elements of the memory device 110, or the system 100 to perform the described functions. Additionally or alternatively, a memory device 110, or a system 100 may perform aspects of the described functions using special-purpose hardware or circuitry.

At 1405, the memory device may receive, from a host device at a memory device (e.g., a memory device with memory cells that include capacitors), a request for an indication of a temperature of the memory device. The operations of 1405 may be performed according to the methods described herein. In some examples, aspects of the operations of 1405 may be performed by a temperature component as described with reference to FIGS. 7 and 8.

At 1410, the memory array may transmit, from the memory device to the host device, the indication of the temperature of the memory device. The operations of 1410 may be performed according to the methods described herein. In some examples, aspects of the operations of 1410 may be performed by a transmission component as described with reference to FIGS. 7 and 8.

At 1415, the memory array may receive, at the memory device, signaling from the host device based on the temperature of the memory device (e.g., based on the temperature of the memory device falling below a threshold). The operations of 1415 may be performed according to the methods described herein. In some examples, aspects of the operations of 1415 may be performed by a signaling component as described with reference to FIGS. 7 and 8.

An apparatus is described. The apparatus may include means for receiving, from a host device at a memory device, a request for an indication of a temperature of the memory device, means for transmitting, from the memory device to the host device, the indication of the temperature of the memory device, and means for receiving, at the memory device, signaling from the host device based on the temperature of the memory device (e.g., based on the temperature of the memory device falling below a threshold).

Another apparatus is described. The apparatus may include a controller or other circuitry configured to cause the apparatus to receive, from a host device at a memory device, a request for an indication of a temperature of the memory device, transmit, from the memory device to the host device, the indication of the temperature of the memory device, and receive, at the memory device, signaling from the host device based on the temperature of the memory device (e.g., based on the temperature of the memory device falling below a threshold).

Some examples of the method or apparatuses may further include operations, features, means, or instructions for receiving, at the memory device, a command from the host device at a time based on the temperature of the memory device (e.g., based on the temperature of the memory device falling below a threshold), where the signaling includes the command.

Some examples of the method or apparatuses may further include operations, features, means, or instructions for receiving, at the memory device, a first command and a second command from the host device, where an elapsed time between the first command the second command may be based on the temperature of the memory device, and where the signaling includes the first command and the second command.

Some examples of the method or apparatuses may further include operations, features, means, or instructions for receiving, at the memory device, an indication of a value of a parameter for operating the memory device, where the value of the parameter may be based on the temperature of the memory device, and where the signaling includes the indication of the value of the parameter, and storing the value of the parameter at the memory device.

In some examples of the method or apparatuses, the parameter includes a timing, frequency, or voltage parameter for the memory device.

Some examples of the method or apparatuses may further include operations, features, means, or instructions for determining the temperature of the memory device based on a sensor internal to the memory device.

In some examples of the method or apparatuses, the memory device includes cells having capacitive storage elements (e.g., capacitors).

It should be noted that the methods, systems, and apparatuses described herein describe possible implementations, and that the operations and the steps may be rearranged or otherwise modified and that other implementations are possible. Further, aspects from two or more of the methods or other techniques may be combined.

The description herein provides examples, and is not limiting of the scope, applicability, or examples set forth in the claims. Changes may be made in the function and arrangement of elements discussed without departing from the scope of the disclosure. Some examples may omit, substitute, or add various operations, procedures, or components as appropriate. Also, features described with respect to some examples may be combined in other examples.

Although certain features or techniques may be described herein with respect to or in the context of capacitive memory technology (e.g., DRAM technology), such descriptions are for illustrative purposes, and one of ordinary skill in the art will appreciate that the teachings herein may be applied to any type of memory device. For example, the teachings herein may be applied to volatile or non-volatile memory devices such as magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signaling as a single signal. However, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The phrase "coupled between" may refer to an order of components in relation to each other, and may refer to an electrical coupling. In one example, a component "B" that is electrically coupled between a component "A" and a component "C" may refer to an order of components of "A-B-C" or "C-B-A" in an electrical sense. In other words, electrical signals (e.g., voltage, charge, current) may be passed from component A to component C by way of component B.

A description of a component B being "coupled between" component A and component C should not necessarily be interpreted as precluding other intervening components in the described order. For example, a component "D" may be coupled between the described component A and component B (e.g., referring to an order of components of "A-D-B-C" or "C-B-D-A" as examples), while still supporting component B being electrically coupled between component A and component C. In other words, the use of the phrase "coupled between" should not be construed as necessarily referencing an exclusive sequential order.

Further, a description of component B being "coupled between" component A and component C does not preclude a second, different coupling between component A and component C. For example, component A and component C may be coupled with each other in a separate coupling that is electrically parallel with a coupling via component B. In another example, component A and component C may be coupled via another component "E" (e.g., component B being coupled between component A and component C and component E being coupled between component A and component C). In other words, the use of the phrase "coupled between" should not be construed as an exclusive coupling between components.

The term "coupling" may refer to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" may refer to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "electrode" may refer to an electrical conductor, and in some cases, may be employed as an electrical contact to a memory cell or other component of a memory array. An electrode may include a trace, wire, conductive line, conductive layer, or other feature that provides a conductive path between elements or components of memory array.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (e.g., majority carriers are signals), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (e.g., A and B and C).

As used herein, the term "substantially" means that the modified characteristic (e.g., a verb or adjective modified by the term "substantially") need not be absolute but is close enough so as to achieve the advantages of the characteristic, or close enough that the characteristic referred to is true in the context of the relevant aspects of the disclosure.

As used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   identifying a temperature of a memory device or of a host device coupled with the memory device;
   determining a value of a voltage for operating the memory device based at least in part on the temperature;
   transmitting signaling to a power supply for the memory device based at least in part on the value of the voltage; and
   transmitting, based at least in part on transmitting the signaling to the power supply, a command to the memory device with a timing that is based at least in part on the value of the voltage.

2. The method of claim 1, wherein the signaling to the power supply indicates the value of the voltage.

3. The method of claim 1, further comprising:
   sensing a temperature of the host device, wherein identifying the temperature of the memory device or the host device is based at least in part on sensing the temperature of the host device.

4. The method of claim 3, further comprising:
   identifying an offset between the temperature of the host device and the temperature of the memory device, wherein identifying the temperature of the memory device is based at least in part on the offset.

5. The method of claim 1, further comprising:
   determining that the temperature of the memory device or of the host device is below a threshold; and
   determining the value of the voltage for operating the memory device based at least in part on determining that the temperature of the memory device or of the host device is below the threshold.

6. The method of claim 1, wherein the memory device comprises cells having capacitive storage elements.

7. An apparatus, comprising:
   logic operable to couple with a power supply for a memory device, the logic configured to:
     identify a temperature of a memory device or of a host device coupled with the memory device;
     determine a value of a voltage for operating the memory device based at least in part on the temperature;
     transmit signaling to the power supply based at least in part on the value of the voltage; and
     configure the host device to transmit, based at least in part on transmitting the signaling to the power supply, a command to the memory device with a timing that is based at least in part on the value of the voltage.

8. The apparatus of claim 7, wherein the signaling to the power supply indicates the value of the voltage.

9. The apparatus of claim 7, wherein the logic is further configured to:
   sense a temperature of the host device, wherein identifying the temperature of the memory device or the host device is based at least in part on sensing the temperature of the host device.

10. The apparatus of claim 9, wherein the logic is further configured to:
    identify an offset between the temperature of the host device and the temperature of the memory device, wherein identifying the temperature of the memory device is based at least in part on the offset.

11. The apparatus of claim 7, wherein the logic is further configured to:
    determine that the temperature of the memory device or of the host device is below a threshold; and
    determine the value of the voltage for operating the memory device based at least in part on determining that the temperature of the memory device or of the host device is below the threshold.

12. The apparatus of claim 7, wherein the logic is a component of the host device.

13. The apparatus of claim 7, wherein the memory device comprises cells having capacitive storage elements.

14. A system, comprising:
    a memory device;
    a host device coupled with the memory device;
    one or more temperature sensors operable to indicate a temperature of the memory device or the host device coupled with the memory device; and
    a power supply coupled with the memory device and operable to output a voltage based at least in part on the indicated temperature of the memory device or the host device,
    wherein the host device is configured to transmit a command with a timing that is based at least in part on the voltage output by the power supply.

15. The system of claim 14, wherein the one or more temperature sensors comprise a temperature sensor of the memory device.

16. The system of claim 14, wherein the one or more temperature sensors comprise a temperature sensor of the host device.

17. The system of claim 14, wherein the one or more temperature sensors comprise a temperature sensor of a coupling component coupled with the memory device and coupled with the host device.

18. The system of claim 14, wherein the host device is further configured to:
    receive the indication of the temperature from the one or more temperature sensors; and
    transmit signaling to the power supply to output the voltage based at least in part on receiving the indication of the temperature, wherein transmitting the command is based at least in part on transmitting the signaling to the power supply.

* * * * *